United States Patent [19]

Van de Kerkhof

[11] Patent Number: 5,235,647
[45] Date of Patent: Aug. 10, 1993

[54] DIGITAL TRANSMISSION SYSTEM, AN APPARATUS FOR RECORDING AND/OR REPRODUCING, AND A TRANSMITTER AND A RECEIVER FOR USE IN THE TRANSMISSION SYSTEM

[75] Inventor: Leon M. Van de Kerkhof, Eindhoven, Netherlands

[73] Assignee: U.S. Philips Corporation, New York, N.Y.

[21] Appl. No.: 667,339

[22] Filed: Mar. 8, 1991

[30] Foreign Application Priority Data

Nov. 5, 1990 [EP] European Pat. Off. ......... 90202911.5

[51] Int. Cl.$^5$ .............................................. G10L 5/00
[52] U.S. Cl. ...................................... 381/37; 381/36; 364/724.1
[58] Field of Search ................................... 381/36–40; 364/724.1, 724.13

[56] References Cited

U.S. PATENT DOCUMENTS

| | | | |
|---|---|---|---|
| 4,691,292 | 9/1987 | Rothweiler | 364/724.13 |
| 4,799,179 | 1/1989 | Masson | 364/724.1 |
| 5,109,417 | 4/1992 | Fielder | 381/36 |

Primary Examiner—Emanuel S. Kemeny
Attorney, Agent, or Firm—Michael E. Marion

[57] ABSTRACT

A digital transmission system has a transmitter (3,6,9) and a receiver (13,16,19). The transmitter includes a coder for subband coding of the digital signal, by dividing the digital signal band into successive subbands having approximately equal bandwidths. The receiver recontructs a replica of the digital signal by merging the subbands to the digital signal band. The transmitter includes analysis filter means (6) and receiver includes synthesis filter means (16). The filter coefficients in the analysis filter means are unequal to the filter coefficients in the synthesis filter means.

26 Claims, 12 Drawing Sheets

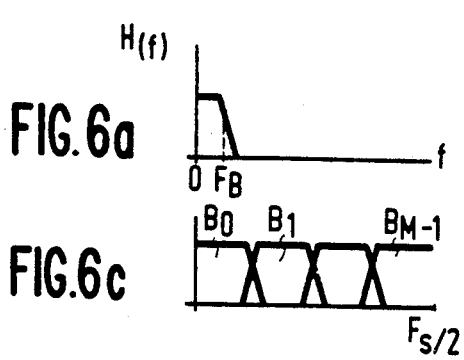
FIG.6a
FIG.6c
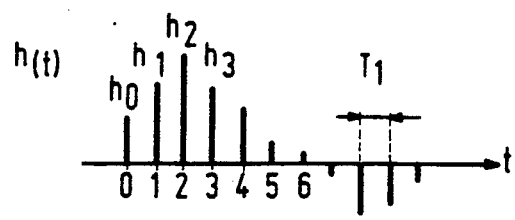
FIG.6b
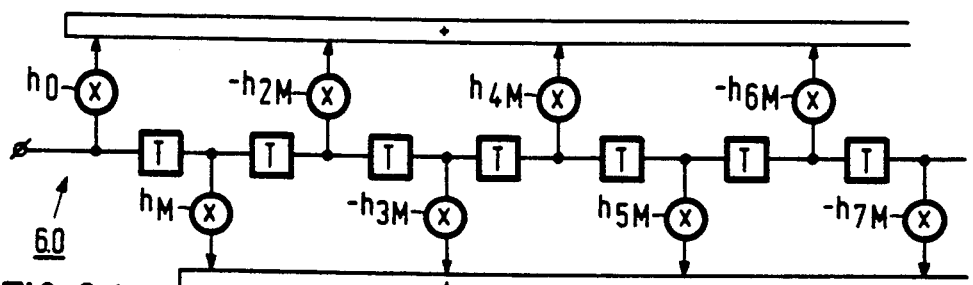
FIG.6d
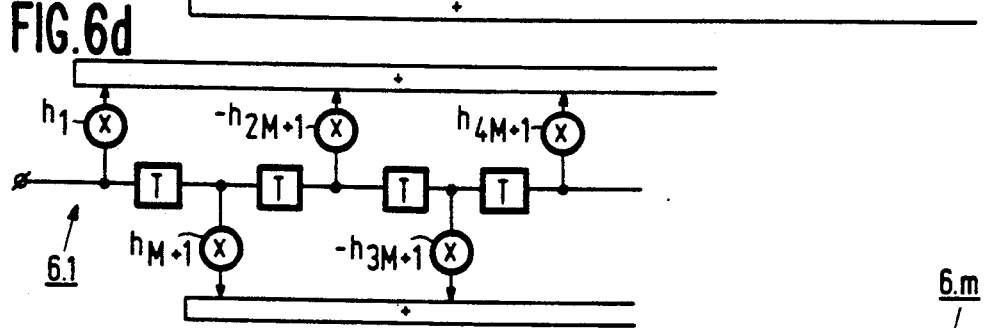
FIG.6e
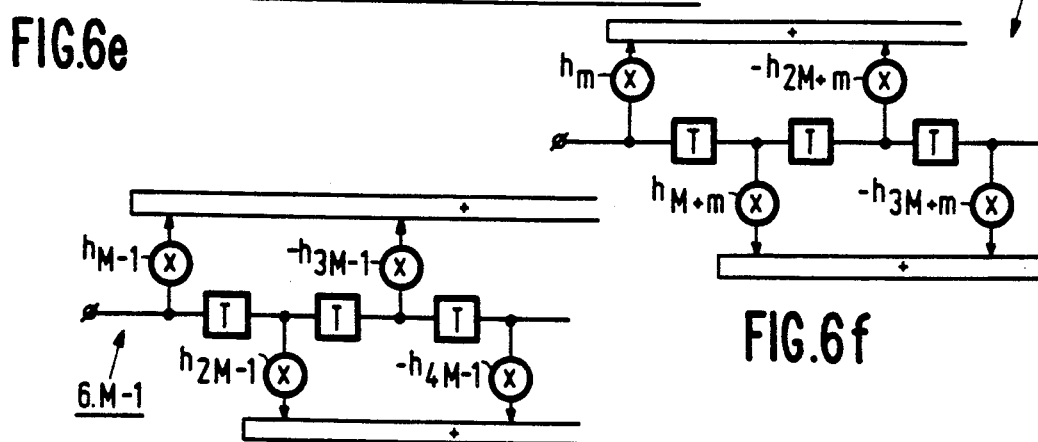
FIG.6f
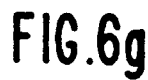
FIG.6g

FIG. 8

| DELAY | n+1=(LENGTH OF ANALYSIS FILTERS) | | | | | | | | |
|---|---|---|---|---|---|---|---|---|---|
| D | 12 | 16 | 20 | 24 | 28 | 32 | 36 | 40 | 42 |
| 12 | -35 | -35 | -35 | -35 | -35 | -35 | -35 | -35 | -35 |
| 14 | -54 | -57 | -57 | -57 | -57 | -57 | -57 | -57 | -57 |
| 16 | -35 | -85 | -88 | -88 | -88 | -88 | -88 | -88 | -88 |
| 18 | -20 | -57 | -88 | -91 | -91 | -91 | -91 | -91 | -91 |
| 20 | -3 | -35 | -88 | -102 | -106 | -106 | -106 | -106 | -106 |
| 22 | 0 | -20 | -57 | -91 | -119 | -122 | -122 | -122 | -122 |
| 24 | 0 | -3 | -35 | -88 | -105 | -139 | -142 | -142 | -142 |
| 26 | 0 | 0 | -20 | -57 | -91 | -122 | -170 | -173 | -174 |
| 28 | ... | 0 | -3 | -35 | -88 | -105 | -142 | -174 | -178 |
| 30 | ... | 0 | 0 | -20 | -57 | -91 | -122 | -173 | -188 |
| 32 | ... | ... | 0 | -3 | -35 | -88 | -105 | -142 | -177 |

M=32, p+1(=length of synthesis filters)=16
standard filter has 511 coefficients

DIGITAL TRANSMISSION SYSTEM, AN APPARATUS FOR RECORDING AND/OR REPRODUCING, AND A TRANSMITTER AND A RECEIVER FOR USE IN THE TRANSMISSION SYSTEM

BACKGROUND OF THE INVENTION

The invention relates to a digital transmission system having a transmitter and a receiver, the transmitter including a coder for subband coding of a digital signal, such as a digital audio signal, having a given sampling rate $F_S$, and the receiver including a decoder for decoding the subband coded signal, the coder being responsive to the digital signal, for generating a number of M sub-band signals with sampling rate reduction, the coder dividing the digital signal band into successive subbands of band numbers $m(0 \leq m \leq M-1)$ increasing with frequency, the subbands having approximately equal bandwidths, the decoder being responsive to the M subband signals for constructing a replica of the digital signal, this decoder merging the subbands to the digital signal band, with sampling rate increase, the coder comprising analysis filter means and a first signal processing unit, the analysis filter means comprising M analysis filters, each having one input and two outputs, the 2M outputs of the filters being coupled to 2M outputs of the analysis filter means for supplying 2M output signals with a sampling rate $F_S/M$, each analysis filter being adapted to apply two different filterings on the signal applied to its input and to supply each of the two different filtered versions of that input signal to a corresponding one of the two outputs, each one of the 2M filter outputs being coupled to a corresponding one of 2M inputs of the first signal processing unit, the first processing unit having M outputs coupled to M outputs of the coder for supplying the M subband signals, the first signal processing unit being adapted to supply output signals on each of M outputs, an output signal being a combination of at least a number of input signals applied to its 2M inputs, the decoder comprising a second signal processing unit and synthesis filter means, the second signal processing unit having M inputs for receiving the M subband signals and having 2M outputs, the synthesis filter means comprising M synthesis filters each having 2 inputs, and one output coupled to the decoder output, the second signal processing unit being adapted to generate an output signal on each of its 2M outputs, an output signal being a combination of at least a number of input signals applied to its M inputs, each pair of outputs of the second signal processing unit being coupled to a pair of two inputs of a corresponding one of the M synthesis filters, each synthesis filter having one output, each synthesis filter being adapted to apply different filterings on the two signals applied to the two inputs and to supply a combination of the two filtered signals to its output, each output can be coupled to the output of the synthesis filter means for supplying the replica of the digital signal having a sampling rate $F_S$, the coefficients of the analysis or the synthesis filters being derived from the coefficients of a standard filter having a low pass filter characteristic with a bandwidth approximately equal to half the bandwidth of the subbands, $\alpha(x,y)$ in a $M \times 2M$ coefficient matrix A being the multiplication coefficient in the first processing unit, with which the input signal applied to the y-th of the 2M inputs of the first processing unit is multiplied before it is applied to the x-th of the M outputs of the first processing unit, $\beta(u,v)$ in a $2M \times M$ coefficient matrix B being the multiplication coefficient in the second processing unit, with which the input signal applied to the v-th of the M inputs of the second processing unit is multiplied before it is applied to the u-th of the 2M outputs of the second processing unit, and to an apparatus for recording and/or reproducing a digital signal, and to a transmitter and a receiver for use in the digital transmission system.

The digital transmission described in the foregoing is known from publication No. 27.2 titled "Polyphase quadrature filters—a new subband coding technique", by J. H. Rothweiler in Proceedings of the ICASSP 83, Boston, the pages 1280–1283. The publication describes a method by means of which the coefficients of the analysis filters and the coefficients of the synthesis filters can be derived from the same standard low pass filter H(f). This filter is called a prototype filter in the publication. The analysis filters have a number of filter coefficients that equals the number of filter coefficients of the synthesis filters. European Patent Application No. 90.201.369.7 (U.S. Ser. No. 532,465, filed May 31, 1990) also gives an explanation how to determine the filter coefficients for the analysis filters and the synthesis filters from a standard low pass filter having an odd number of coefficients in the impulse response. Also in this case, the number of filter coefficients in the analysis filters, equals the number of coefficients in the synthesis filters.

By increasing the numbers of filter coefficients on the transmitter side and the receiver side to the same extent, an improvement of the transmission quality of the known transmission system can be obtained. This however leads to the disadvantage of an increased complexity of the transmission system, on the transmitter side as well as the receiver side.

SUMMARY OF THE INVENTION

The invention has for its object to provide for a transmission system with an improved transmission quality with an increase in circuitry complexity either at the transmitter or the receiver side, or for a transmission system with the same transmission quality but less complexity on the one side and an increased complexity on the other side and which systems make it possible to realize various transmissions with different transmission qualities.

To that purpose, the transmission system in accordance with the invention is characterized in that the coefficients $\alpha(x,y)$ and $\beta(u,v)$ are chosen such that, if coefficients $\phi(u,y)$ in a $2M \times 2M$ coefficient matrix C are calculated in accordance with the following formula $$\phi(u,y) = \sum_{i=0}^{M-1} \beta(u,i)\alpha(i,y)$$

from the coefficients $\alpha(x,y)$ and $\beta(u,v)$, a number of at least two separate pairs of values $(u_2,u_3)$ and corresponding separate values $(y_1,y_2)$ are present for which the coefficients $\phi(u_2,y_1)$, $\phi(u_2,y_2)$, $\phi(u_3,y_1)$ and $\phi(u_3,y_2)$ are non zero, the coefficients $\phi(u_2,y)$ and $\phi(u_3,y)$ are zero for y not equal to $y_1$ or $y_2$, the coefficients $\phi(u,y_1)$ and $\phi(u,y_2)$ are zero for u not equal to $u_2$ or $u_3$, and in that the number of coefficients of the analysis filters not being equal to the number of coefficients of the synthesis filters.

The invention is based on the recognition that the coefficients of the first signal processing unit in the transmitter and the coefficients of the second signal processing unit in the receiver can be chosen such that, if a matrix multiplication is carried out on those coefficients a product matrix [C] can be obtained having a very special shape.

With this special shape of the product matrix [C] it becomes possible to derive the filter coefficients of the analysis filters and synthesis filters in a different way.

The filter coefficients of either the analysis filters are determined or the synthesis filters from the standard low pass filter coefficients, as indicated previously. Suppose the coefficients for the synthesis filter are calculated in this way. The coefficients for the other filters, in this example the analysis filters, can now be calculated by requiring that the overall transmission via an analysis filter and a corresponding synthesis filter should be such that each impulse applied to an analysis filter will lead to an impulse at the output of the transmission system with a delay and an amplification that is equal for all impulses applied to the various analysis filters. This calculation makes it further possible to calculate a greater or fewer number of coefficients for the analysis filters than there are coefficients in the synthesis filter.

The transmission quality can be improved by calculating more coefficients for the analysis filters then there are coefficients in the synthesis filters. This means that the circuitry on the transmitters side can be increased, which leads to an improved transmission quality. Another possibility is that the number of coefficients in the synthesis filters can be reduced. When at the same time increasing the number of coefficients in the analysis filters, the transmission quality can still be improved. This has the advantage that the receivers can become simpler and thus cheaper, and require a lower power consumption. This advantage is of special importance in portable consumer apparatuses, such as portable radios and portable play-back only apparatuses.

It is equally possible to derive the coefficients of the analysis filters from the standard low pass filter as described in the documents referenced above. In that case, one can calculate the filter coefficients of the synthesis filters from the transmission requirements given above. In that case, the number of coefficients in the synthesis filters can be larger or smaller than the number of coefficients in the analysis filters. When the number of coefficients in the synthesis filters is larger, this also leads to an increased transmission quality.

BRIEF DESCRIPTION OF THE DRAWINGS

The invention will now be explained further with reference to a number of embodiments in the following figure description. The figure description discloses in FIG. 1 an embodiment of the transmission system in accordance with the invention, in the form of a block diagram, FIG. 2 the realization of the sample rate increase by means of the first commutator means, FIG. 3 an embodiment of the analysis filter in the system, FIG. 4 an embodiment of the synthesis filter in the system, FIG. 5a an embodiment of the first signal processing unit in the transmitter and FIG. 5b an embodiment of the second signal processing unit in the receiver, FIGS. 6a–6g the derivation of the coefficients of the analysis filters, in the transmitter, from the filter coefficients of the standard (or prototype) filter H(f), FIGS. 7a–7d the derivation of the coefficients of the synthesis filters in the receiver, from the filter coefficient of the standard filter H(f), FIG. 8 an example of the product matrix [C] that can be obtained when multiplying the coefficient matrices [A] and [B] corresponding to the first and second signal processing units, FIG. 9 two signal paths through the transmission system, FIG. 10 combines FIGS. 10a thru 10n the signals that run through the two signal paths in FIG. 9, FIG. 11 the transmission of a sequence of M impulses in a block through the system, FIG. 12a and 12b two other signal paths through the transmission system, FIG. 13 a table indicating the transmission quality for a number of transmission systems according to the invention, FIG. 14 a number of transmission systems, FIG. 15 a recording apparatus including the transmitter from the transmission system in accordance with the invention, and FIG. 16 a reproducing apparatus including the receiver from the transmission system in accordance with the invention.

Figure 1:
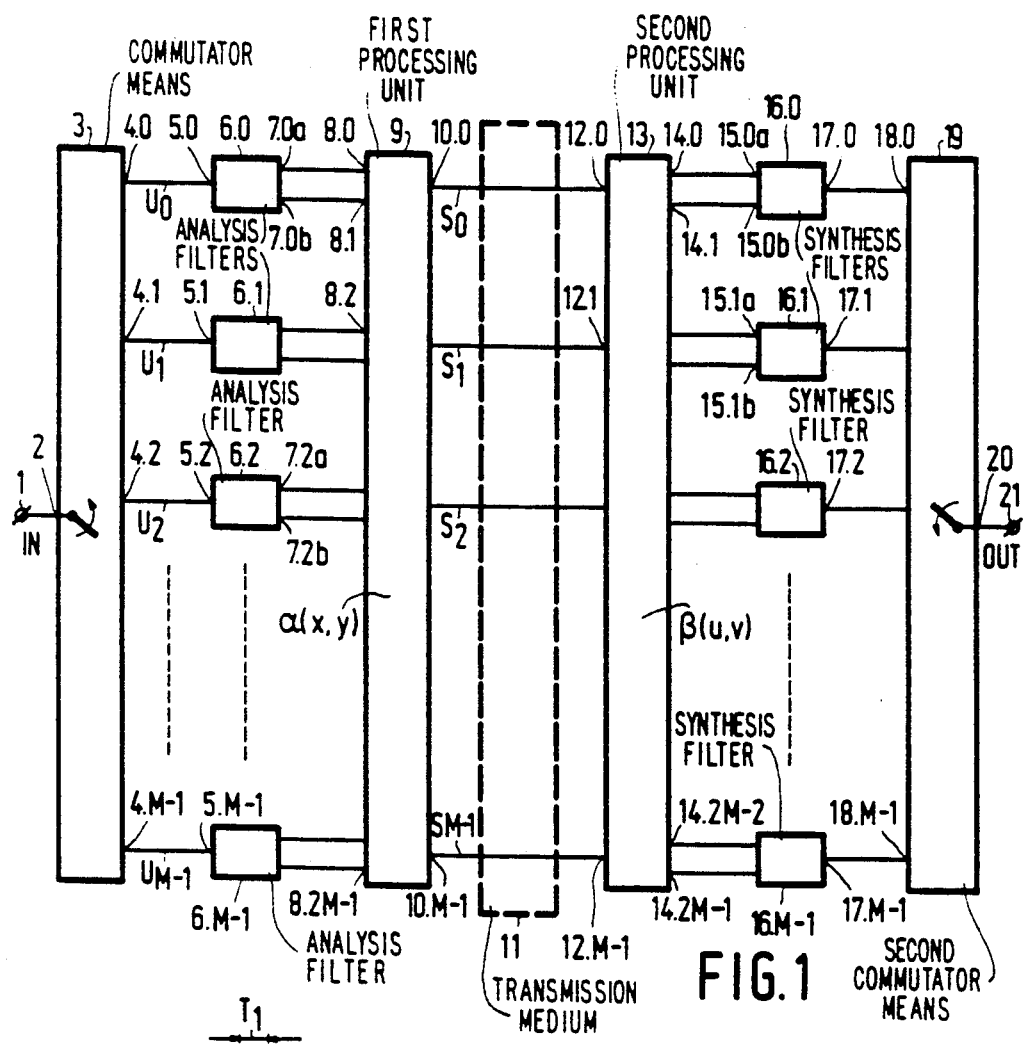
FIG. 1 discloses a block diagram of the digital transmission system. The system has an input terminal 1 coupled to an input 2 of first commutator means 3, for receiving a digital signal IN having a given sampling rate $F_S$. The first commutator means has M outputs 4.0 to 4.M−1 on which output signals $U_O$ to $U_{M-1}$ are available. The first commutator means 3 is adapted to realize a sample rate decrease by a factor M on the input signal IN applied to its input 2. The functioning of the first commutator means 3 will be explained later with reference to FIG. 2. M analysis filters 6.0 to 6.M−1 are present, each analysis filter m having an input 5.m coupled to a corresponding one (4.m) of the M outputs of the first commutator means 3.m runs from 0 to M−1. Each analysis filter 6.m has two outputs 7.ma and 7.mb. Each analysis filter (6.m) is adapted to apply two different filterings on the signal ($U_m$) applied to its input (5.m) and to supply each of the two different filtered versions of that input signal ($U_m$) to a corresponding one of the two outputs (7.ma and 7.mb). The construction and the functioning of the analysis filters will be explained later with reference to FIG. 3. Each one of the 2M filter outputs 7.0a, 7.0b, 7.1a, 7.1b, 7.2a, 7.2b, ..., 7.ma, 7.mb, ..., are coupled to a corresponding one of 2M inputs 8.0, 8.1, ..., 8M, 8M+1, ..., 8.2M−1 of a first signal processing unit 9. The first processing unit 9 has M outputs 10.0 to 10.M−1. The first processing unit 9 is adapted to supply different output signals on each of its M outputs, an output signal being a combination of at least a number of input signals applied to its 2M inputs.

The construction and functioning of the first signal processing unit 9 will be explained later with reference to the FIG. 5a. If the outputs 10.0 to 10.M−1 are identical to the M outputs of the filter means, then this means that the first signal processing unit 9 supplies the M subband signals $S_O$ to $S_{M-1}$, each subband signal $S_m$ being available on a corresponding one (10.m) of the M outputs of the first processing unit 9.

The input signal IN applied to the input 1 and having a sampling rate of $F_S$, occupies a bandwidth equal to $F_S/2$. Division of the signal bandwidth by a factor of M means that the bandwidth of the subbands $B_O$ to $B_{M-1}$ all equal $F_S/2M$, see FIG. 6c, $s_O$ in FIG. 1 being a down sampled version of the signal present in subband $B_O$, $s_1$ being a down sampled version of the signal present in subband $B_1$, etc.

The M subband signals can, if necessary, further be processed, e.g. in an additional quantizer (not shown), in which an (adaptive) quantization can be applied on the signals in order to realise a significant reduction in bit rate. Examples of such quantizers can e.g. be found in the published European patent application No. 289.080 (U.S. Pat. No. 4,896,362).

The signal processing described above is carried out on the transmitter side of the transmission system. The transmitter in the system thus at least includes the elements with reference numerals 3, 6.0 to 6.M−1 and 9, and, if present, the quantizer.

The signals generated in the transmitter are supplied via a transmission medium, schematically indicated by reference numeral 11 in FIG. 1, to the receiver. This might make the application of a further channel coding of the signal necessary, in order to make an error correction possible at the receiver side. The transmission via the transmission medium 11 can be in the form of a wireless transmission, such as e.g. a radiobroadcast channel. However also other media are well possible. One could think of an optical transmission via optical fibres or optical discs, or a transmission via magnetic record carriers.

The information present in the M subbands can be transmitted in parallel via the transmission medium, such as is disclosed in FIG. 1, or can be transmitted serially. In that case time compression techniques are needed on the transmitter side to convert the parallel data stream into a serial data stream, and corresponding time expansion techniques are needed on the receiver side to reconvert the data stream into a parallel data stream, so that the M subband signals $S_O$ to $S_{M-1}$ can be applied to respective ones of the M inputs 12.0 to 12.M−1 of a second processing unit 13. The second processing unit 13 has 2M outputs 14.0 to 14.2M−1. The second signal processing unit 13 is adapted to generate an output signal on each of its 2M outputs, an output signal being a combination of at least a number of input signals applied to its M inputs.

The construction and functioning of the second signal processing unit 13 will be explained later with reference to FIG. 5b. Pairs of outputs, such as 14.0 and 14.1, of the second processing unit 13 are coupled to pairs of inputs, such as 15.0a and 15.0b, of a corresponding one of M synthesis filters 16.0 to 16.M−1. Each synthesis filter 16.m has one output 17.m. The synthesis filters are adapted to apply different filterings on the two signals applied to their two inputs and to supply a combination of the two filtered signals to their output. The construction and functioning of a synthesis filter will be explained later with reference to FIG. 4. The output (17.m) of each synthesis filter (16.m) is coupled to a corresponding one (18.m) of M inputs 18.0 to 18.M−1 of second commutator means 19. An output 20 of the second commutator means is coupled to an output 21 of the transmission system. The functioning of the second commutator means 19 will be explained later with reference to FIGS. 2, 9, 12a and 12b.

The receiver in the system includes at least the elements with reference numerals 13, 17.0 to 17.M−1 and 19.

If the subband signals have been quantized at the transmitter side, a corresponding dequantizer will be needed in the receiver. Such a dequantizer should be coupled before the other signal processing unit 13. Examples of such dequantizers can also be found in the previously mentioned European patent application No. 289.080. The signal processing at the receiver side need to be such that signals $u_{M-1}$ down to $u_O$, see FIG. 2, are present at the outputs of the synthesis filters 16.0 to 16.M−1, and that a reconstructed signal OUT is present at the output terminal 21 which, in the ideal case, equals the input signal IN, applied to the input terminal 1, except for a certain frequency independent time delay and amplification.

Figure 2:
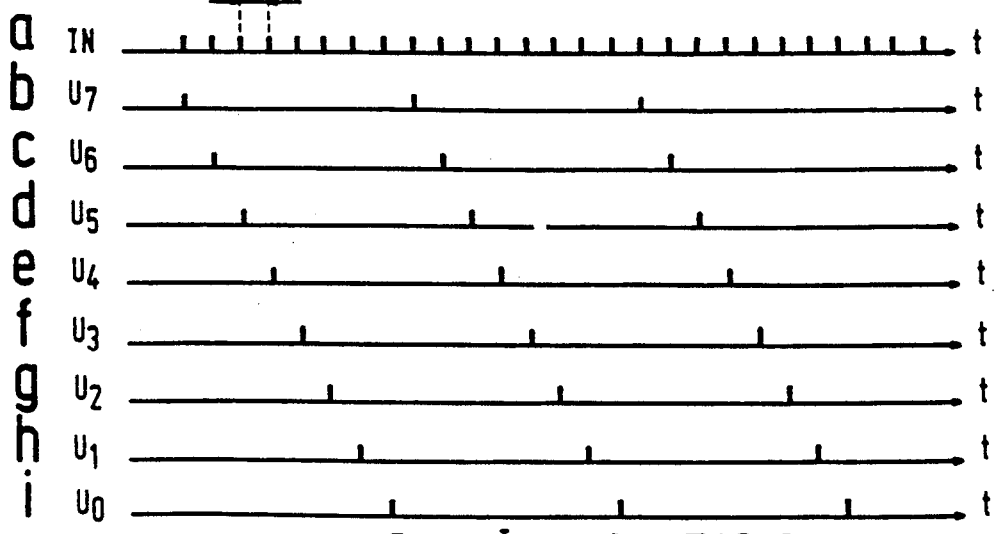

FIG. 2 discloses the functioning of the first and second commutator means 3 and 19 respectively. The signal IN applied to the input terminal 1 is given schematically in FIG. 2(a) as a function of time.

FIG. 2a discloses the samples from which the input signal IN is built up. It discloses only the location of the samples in time, not the amplitude of the samples. The samples are located a time interval $T_1$, which equals $1/F_S$, apart. The sampling rate of the input signal thus equals $F_S$. In the example of FIG. 2, it is assumed that M equals 8. The signals given in FIG. 2b to 2i (again only the locations in time, not the amplitudes are given) disclose the signals $U_7$ down to $U_0$ present at the outputs 4.0 to 4.7 respectively of the means 3. The means 3 acts in fact as a commutator in that it distributes the eight samples contained each time in consecutive imaginary blocks cyclically to the eight outputs, see also the arrow in the commutator in the block 3 of FIG. 1.

From FIG. 2 it is clear that the output signals available at the M outputs of the means 3 have a sampling rate of $F_S/M$. The samples in the output signals are now spaced a time interval T, which equals $M.T_1$, apart.

The reconstruction of the output signal OUT in the second unit 19 will be explained hereafter. The means 19 can also be considered to be a commutator, in that it cyclically couples each of the M inputs 18.0 to 18.7 with the output 20. In this case, samples present at the inputs 18.0 to 18.M−1 are applied, in the order of the sample present at the input 18.0 first, and the sample present at the input 18.M−1 last, to the output 20 of the commutator means 19. This is shown clearly by means of the arrow in the commutator in the block 19 of FIG. 1.

The commutator means 3 can also be built up in a different way, namely by making use of a delay line having tappings at the correct locations along the said delay line. These tappings are then coupled to inputs of decimators, that bring the sampling rate down to the correct value. It is even possible to combine the first commutator means and the analysis filters, especially by making use of the delay line in the first commutator means 3 for (a part of) the delay line(s) in the analysis filters, which is well known in the art, see U.S. Pat. No. 4,691,292 (Rothweiler), FIG. 3. The same reasoning is in fact valid for the second commutator means 19. In this case interpolators are needed in order to realise the sample rate increase.

Figure 3:
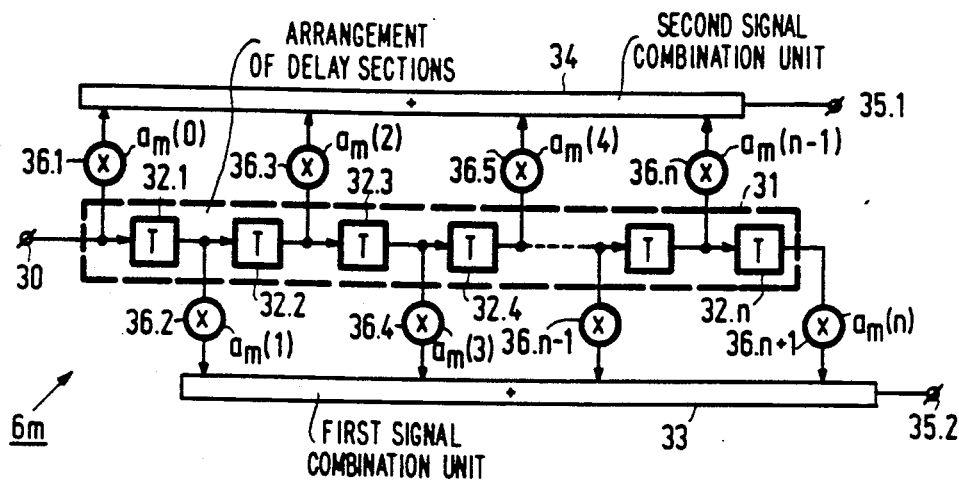

FIG. 3 discloses an embodiment of an analysis filter 6.m. An input 30 of the analysis filter, which equals the input 5.m in FIG. 1, is coupled to a series arrangement 31 of delay sections, having equal delays T. The delay time T equals the time spacing between the impulses in FIG. 2. Outputs of the odd numbered delay sections 32.1, 32.3, ..., 32.n are coupled to inputs of a first signal combination unit 33. Outputs of the even numbered delay sections 32.2, 32.4, ..., are coupled to inputs of a second signal combination unit 34. Outputs of the first and second combination units 33 and 34 form the first and second output 35.1 and 35.2 respectively of the analysis filter 6.m. They equal the outputs 7.ma and 7.mb, respectively in FIG. 1. The input 30 of the filter 6.m is coupled to an input of the second signal combination unit 34 via a multiplication unit 36.1. This multiplication unit multiplies the signals (samples) applied to its input by a factor of $a_m(o)$. The outputs of the odd numbered delay sections are coupled to the inputs of the signal combination unit 33 via multiplication units 36.2, 36.4, ..., 36.n−1 and 36.n+1. They multiply the signals (samples) applied to their respective units by respective factors of $a_m(1)$, $a_m(3)$, ..., $a_m(n)$. The outputs of the even numbered delay sections are coupled to the inputs of the signal combination unit 34 via multiplication units 36.3, 36.5, ..., 36.n. They multiply the signals (samples) applied to their respective inputs by respective factors of $a_m(2)$, $a_m(4)$, ... In a more general definition of the signal combination units, these multiplication units can be considered as being included in the signal combination units. In that case, the signal combination units not only realize a summation of the signals applied to their inputs, but they realize a weighted combination (summation) of these signals. It is evident that, in the case that a multiplication unit has a factor $a_m(i)$ that equals zero, the coupling from the delay section to the signal combination unit including the said multiplication unit is dispensed with. It is further evident that, in the case that the said multiplication unit has a factor $a_m(i)$ that equals one, the multiplication unit is dispensed with, so that the coupling is a direct coupling.

It should be noted that other embodiments for the analysis filter 6.m are possible. Reference is made in this respect to European Patent Application No. 90.201.369.7 (U.S. Ser. No. 532,465, filed May 31, 1990) discloses an other embodiment of the analysis filter.

Please note that the coupling including the multiplication unit 36.n+1 in the filter of FIG. 3, where n is even, is a coupling from the output of the series arrangement 31 to the signal combination unit 34.

Figure 4:
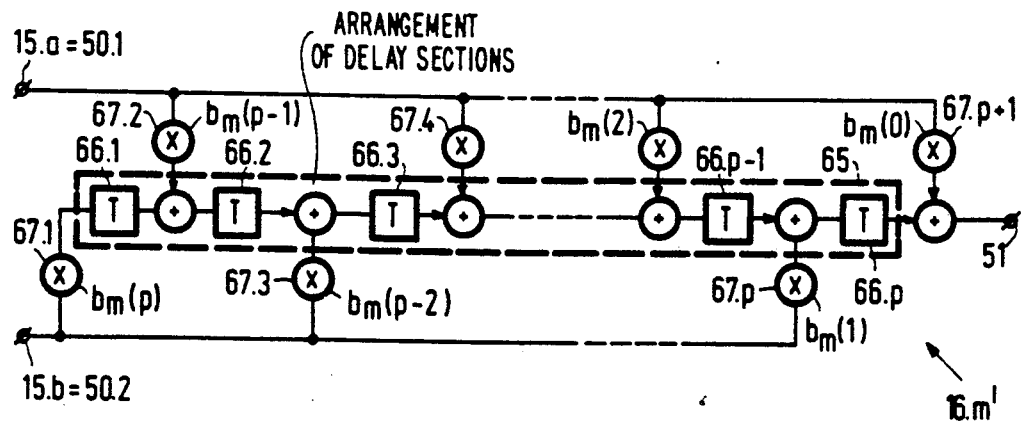

FIG. 4 shows a synthesis filter 16.m' having two inputs 50.1 and 50.2 and one output 51. The inputs equal the inputs 15.ma and 15.mb and the output equals the output 17.m in FIG. 1. The filter includes a series arrangement 65 of delay sections 66.1 to 66.p, having equal delay T. The input 50.1 is coupled to inputs of even numbered delay sections, via multiplication units 67.2, 67.4, ..., 67.p+1. p is thus considered to be an odd number in this example. The input 50.2 is coupled to inputs of odd numbered delay sections via multiplication units 67.1, 67.3, ..., 67.p. The multiplication coefficients in the multiplicated units 67.1 to 61.p+1 equal $b_m(p)$, $b_m(p-1)$, $b_m(p-2)$, ..., $b_m(1)$ and $b_m(0)$ respectively.

The choice for the coefficients $a_m(o)$ to $a_m(n)$ for the filter 6.m of FIG. 3 will be further explained with reference to FIG. 6.

FIG. 6(c) shows the filterband of the digital signal, which is $F_S/2$ Hz broad. The total filterband is divided into M subbands $B_O$ to $B_{M-1}$ of equal bandwidth $F_S/2M$. FIG. 6(a) shows a standard low pass filter or otherwise called: a prototype filter, having a filter characteristic of H(f) and a bandwidth $F_B$ equal to half the bandwidth of the subbands. FIG. 6(b) shows the impulse response of the low pass filter H(f) as a function of time. This impulse response is in the form of an array of impulses at equidistant time intervals $T_1 = 1/F_s$ spaced apart. The impulse response is characterized by an array of values $h_0$, $h_1$, $h_2$, ... indicating the amplitude of the impulses at the time intervals $t=0$, $T_1$, $2T_1$, ...

FIGS. 6(d) to (g) show how the multiplication factors for the multiplication units in the filters 6.0 to 6.M−1 can be obtained using the impulse response of the standard low pass filter H(f). As can be seen the factors $a_0(0)$ to $a_{M-1}(0)$, being the multiplication factors for the multiplication units 36.1 in the filters 6.0 to 6.M−1, see FIG. 3, equal $h_0$ to $h_{M-1}$ respectively. The factors $a_0(1)$ to $a_{M-1}(1)$, being the multiplication factors for the multiplication units 36.2 in the filters 6.0 to 6.M−1, see FIG. 3, equal $h_M$ to $h_{2M-1}$ respectively, the factors $a_0(2)$ to $a_{M-1}(2)$ equal $-h_{2M}$ to $-h_{3M-1}$ respectively, the factors $a_0(3)$ to $a_{M-1}(3)$ equal $-h_{3M}$ to $-h_{4M-1}$ respectively and so on, see especially the filter in FIG. 6d, which filter is worked out a little bit further. The standard filter H(f) can have an odd or an even number of impulses. This means that the filter has an odd or an even number of coefficients $h_0$, $h_1$, $h_2$, ...

The procedure is such that, if M analysis filters, such as the filter of FIG. 3 with each filter having a number of n+1 coefficients $a_m(0)$ to $a_m(n)$, are needed, an impulse response h(t) for the standard filter H(f) should be calculated having at most (n+1).M impulses $h_0$, $h_1$, $h_2$, ... In that case there are sufficient coefficients (impulses) in the impulse response h(t) to derive the filter coefficients from this impulse response. If the number of impulses in the standard filter H(f) is less than (n+1)M then zeroes are added before and behind the impulse response, so as to obtain a number of exactly (n+1)M coefficients.

The method of calculating the filter coefficients $b_m(0)$ to $b_m(p)$ for the synthesis filters from the coefficients of the standard low pass filter H(f) of FIG. 6, is as follows.

FIG. 7a to 7d disclose parts of the synthesis filters 16.0, 16.1, 16.m and 16.M−1 respectively. With M synthesis filters, each filter having a number of p+1 coefficients $b_m(0)$ to $b_m(p)$, an impulse response h(t) for the standard filter H(f) should be calculated having at most (p+1)M impulses $h_0$, $h_1$, $h_2$, ... With the impulse response h(t) as given in FIG. 6a one can derive the filter coefficients for the filters 16.0 to 16.M−1 in the way as shown in FIG. 7. That is: the coefficients $b_m(0)$ for the filters 16.0 to 16.M−1 equal the values $h_0$ to $h_{M-1}$ respectively, the filter coefficients $b_m(1)$ for the filters 16.0 to 16.M−1 equal the values $h_M$ to $h_{2M-1}$, the coefficients $b_m(2)$ for the filters 16.0 to 16.M−1 equal the values $-h_{2M}$ to $-h_{3M-1}$, ... and so on.

In European Patent Application No. 90.201.369.7 (U.S. Ser. No. 532,465, filed May 31, 1990) the standard filter H(f) for deriving the coefficients for the analysis filters is the same as for the derivation of the coefficients of the synthesis filters. That means that the number of filter coefficients in the analysis filter means equals the number of filter coefficients in the synthesis filter means, and that the coefficients in the analysis filters equal the corresponding coefficients in the synthesis filters.

Figure 5A:
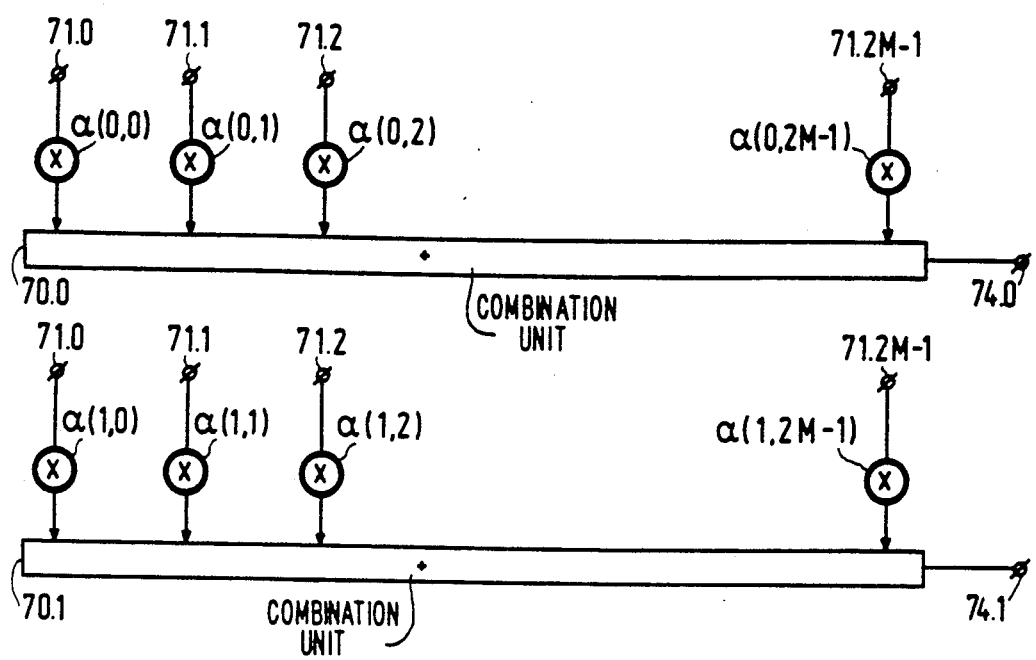
Figure 5A:
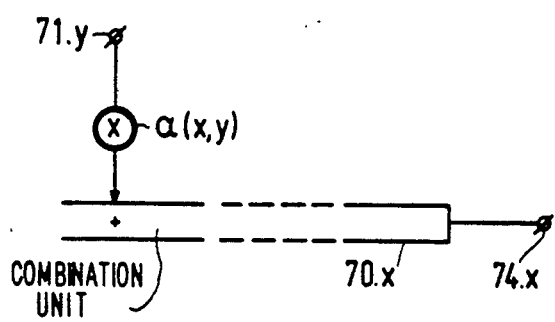
Figure 5A:
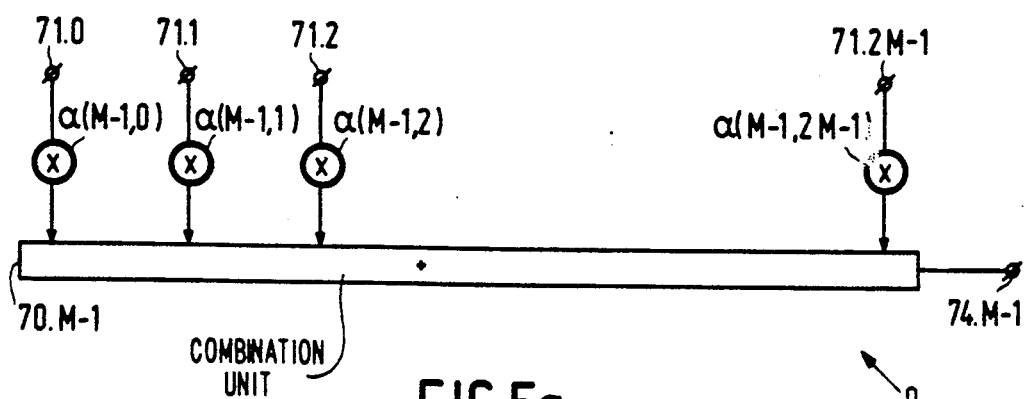

FIG. 5a shows an embodiment of the processing unit 9. The processing unit 9 includes M signal combination units 70.0 to 70.M−1. 2M inputs, 71.0 to 71.2M−1, of the signal processing unit 9 are coupled via corresponding multiplication units that multiply the samples applied to the inputs 71.0 to 71.2M−1 with factors $a(0,0)$ to $a(0,2M−1)$ respectively, to corresponding inputs of the combination unit 70.0. The 2M inputs of the processing unit are also coupled to inputs of the combination unit 70.2, via corresponding multiplication units that multiply the samples applied to the inputs 71.0 to 71.2M−1 with factors $\alpha(1,0)$ to $\alpha(1,2M-1)$ respectively. This goes on for all the other combination units 70.x, where x runs from 0 to M−1 inclusive. This means that the y-th input 71.y is coupled to the output 74.x via a corresponding multiplication unit that multiplies the samples applied to the input 71.y with a factor $\alpha(x,y)$, and where y runs from 0 to 2M−1 inclusive. The inputs 71.0 to 71.2M−1 correspond in that order with the inputs 8.0 to 8.2M−1 in FIG. 1. The outputs 74.0 to 74.M−1 in that order correspond with the outputs 10.0 to 10.M−1 in FIG. 1.

Figure 5B:
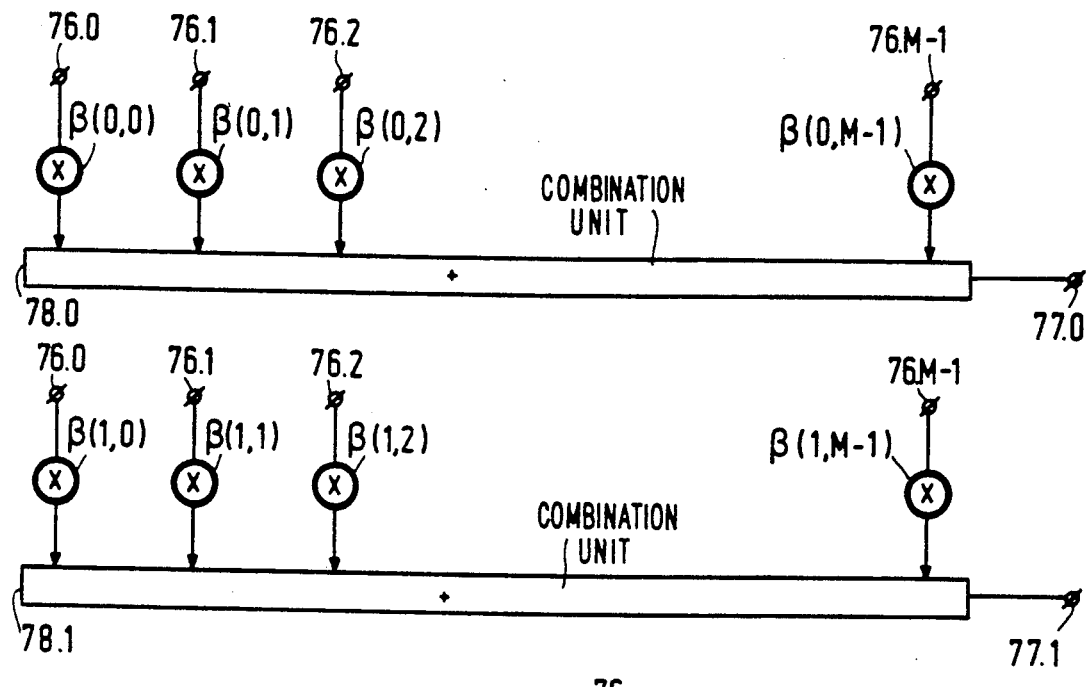
Figure 5B:
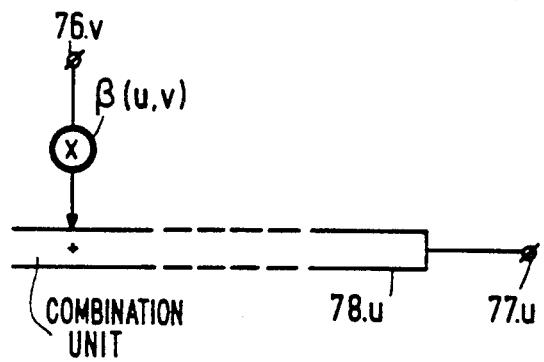
Figure 5B:
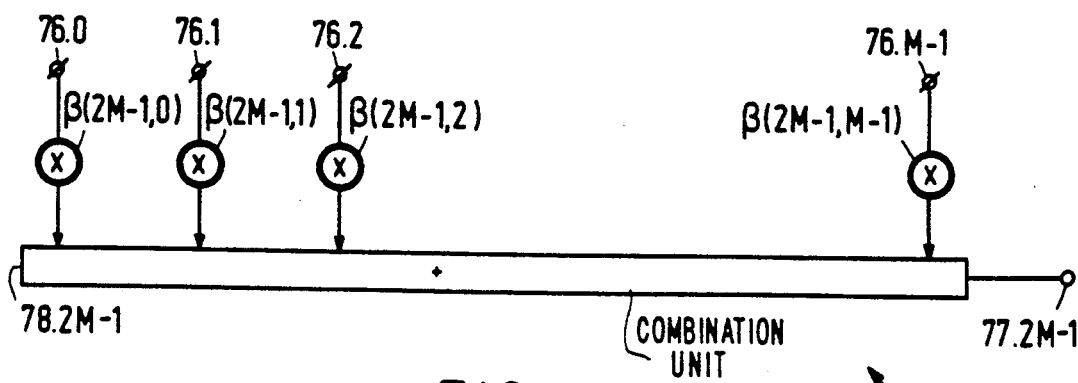
Figure 7A:
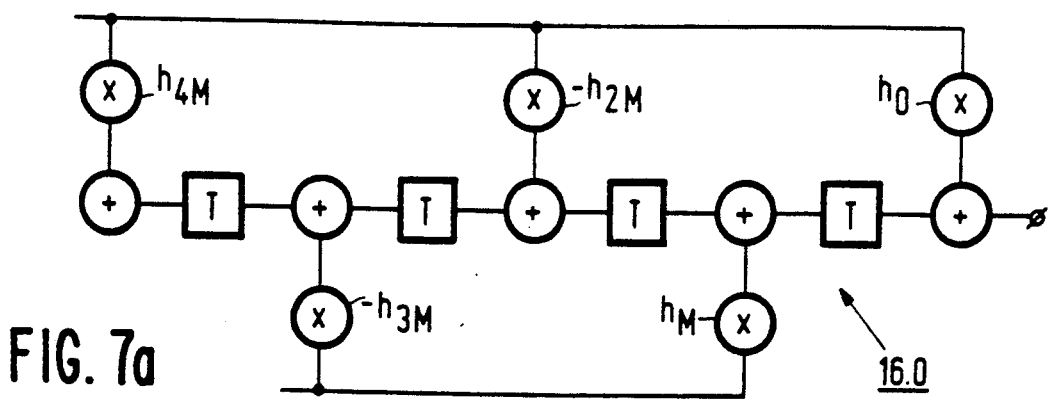
Figure 7B:
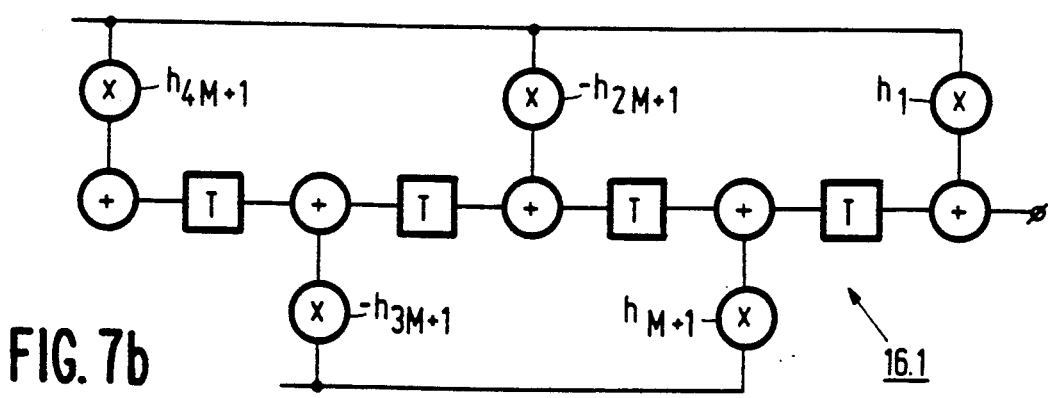
Figure 7C:
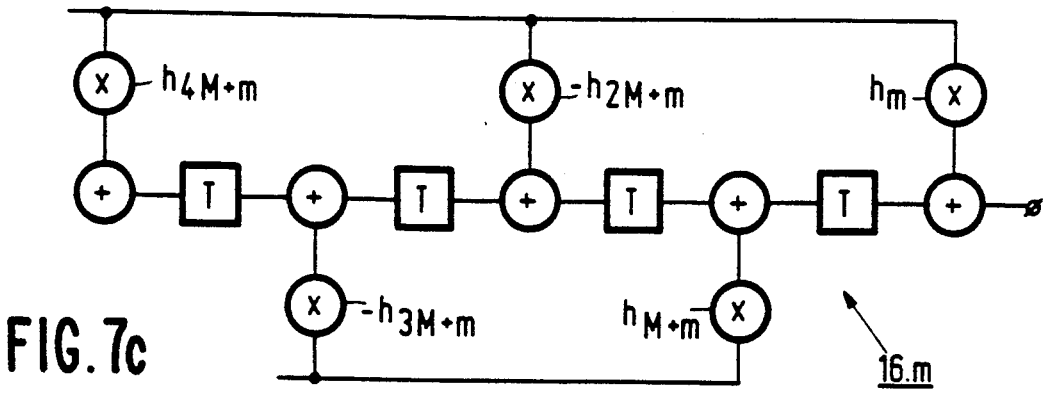
Figure 7D:
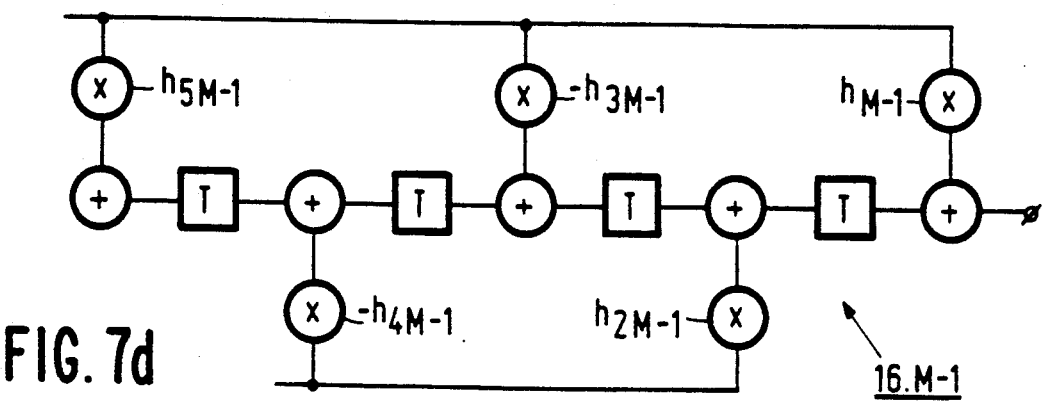

FIG. 5b shows an embodiment of the second processing unit 13. The processing unit 13 includes 2M signal combination units 78.0 to 78.2M−1. M inputs 76.0 to 76.M−1 of the signal processing unit 13 are coupled via corresponding multiplication units that multiply the samples applied to the inputs 76.0 to 76.M−1 with factors $\beta(0,0)$ to $\beta(0,M-1)$ respectively to corresponding inputs of the combination unit 78.0. The M inputs of the processing unit 13 are also coupled to inputs of the combination unit 78.1 via corresponding multiplication units that multiply the samples applied to the inputs 76.0 to 76.M−1 with factors $\beta(1,0)$ to $\beta(1,M-1)$ respectively. This goes on for all the other signal combination units. 78.u, where u runs from 0 to 2M−1 inclusive. This means that the v-th input 76.v is coupled to the u-th output via a corresponding multiplication unit that multiplies the samples applied to the input 76.v with a factor $\beta(u,v)$, and the u-th combination unit 78.u, where v runs from 0 to M−1 inclusive. The inputs 76.0 to 76.M−1 correspond in that order to the inputs 12.0 to 12.M−1 in FIG. 1. The outputs 77.0 to 77.2M−1 correspond in that order with the outputs 14.0 to 14.2M−1 in FIG. 1.

In European Patent Application No. 90.201.369.7 (PHQ 89.018) coefficients $\alpha(x,y)$ are given for the first processing unit on the transmitter side and coefficients $\beta(u,v)$ are given for the second processing unit on the receiver side. In this patent application, the filter coefficients for the analysis and synthesis filters are further both determined from the same standard low pass filter H(f) in a way as explained hereinbefore with reference to FIG. 6 and 7.

With the filter coefficients for the analysis filters and the synthesis filters and with the coefficient $\alpha(x,y)$ and $\beta(u,v)$ for the processing units, as they are given in European Patent Application No. 90.201.369.7 (U.S. Ser. No. 532,465, filed May 31, 1990), one realizes a transmission system that is practically fully devoid of any aliasing distortion, so a replica of the digital signal can be obtained at the receiver side that is practically identical to the digital signal supplied to the transmitter, except for a certain frequency independent time delay and amplification.

The coefficients $\alpha(x,y)$ and $\beta(u,v)$ can be considered as matrix coefficients in an M×2M matrix [A] and a 2M×M matrix [B] respectively. Multiplication of both matrices leads to a 2M×2M matrix [C] having matrix coefficients $\phi(u,y)$ for which the following relation holds $$\phi(u,y) = \sum_{i=0}^{M-1} \beta(u,i)\alpha(i,y)$$

When using the coefficients for $\alpha(x,y)$ and $\beta(u,v)$ as given in European Patent Application No. 90.201.369.7, (U.S. Ser. No. 532,465, filed May 31, 1990), one obtains a matrix [C] for which the following equations are valid:

There is one pair of values $(u_2,u_3)$ and a corresponding pair of values $(y_1,y_2)$ for which holds that: $\phi(u_2,y_1)$, $\phi(u_2,y_2)$, $\phi(u_3,y_1)$ and $\phi(u_3,y_2)$ are non zero, the coefficients $\phi(u_2,y)$ and $\phi(u_3,y)$ are zero for y not equal to $y_1$ or $y_2$, and the coefficients $\phi(u,y_1)$ and $\phi(u,y_2)$ are zero for u not equal to $u_2$ or $u_3$.

Moreover there is at least a second pair of values $(u_2,u_3)$ and a corresponding second pair of values $(y_1,y_2)$ for which the above relations hold. The pairs do not overlap. That means that the coefficients for u (or y) in one pair are unequal to the coefficients for u (or y) in a second pair.

This is the most general requirement for the matrix [C]. More restrictive requirements for the matrix [C] can be as follows: In the case that the standard (or prototype) filter has an even number of coefficients, it can occur that only such pairs $(u_2,u_3)$ and $(y_1,y_2)$ as described above are present.

If the standard (or prototype) filter has an odd number of coefficients, it can occur that at least one pair of values $(u_0,u_1)$ and a corresponding pair of values $(y_0,y_4)$ are present for which all the coefficients $\phi(u_0,y)$, $\phi(u_1,y)$, $\phi(u,y_0)$ and $\phi(u,y_4)$, except one, which is $\phi(u_1,y_0)$, are zero. The pair(s) of values $(u_0,u_1)$ and $(y_0, y_4)$ again do not overlap with other pairs of values. If there is exactly one pair of values $(u_0,u_1)$ and $(y_0,y_4)$, the matrix [C] can further be characterized by the fact that for the remaining 2M−2 values for u and y, there are exactly M−1 separate pairs of value u, such as $(u_2, u_3)$ and exactly M−1 corresponding separate pairs of values y, such as $(y_1, y_2)$, for which the coefficients $\phi(u_2,y_1)$, $\phi(u_2,y_2)$, $\phi(u_3,y_1)$ and $\phi(u_3,y_2)$ are non zero, the coefficients $\phi(u_2,y)$ and $\phi(u_3,y)$ are zero for y not equal to $y_2$ or $y_3$, and the coefficients $\phi(u,y_1)$ and $\phi(u,y_2)$ are zero for u not equal to $u_2$ or $u_3$, as specified previously. It should be noted here, that not only the transmission system as described in European Patent Application No. 90.201.369.7 (Ser. No. 532,465, filed May 31, 1990) leads to [C] matrix as described hereinbefore. There are also other values for the coefficients in the processing units possible that lead to a [C] matrix as defined above.

Figure 8:
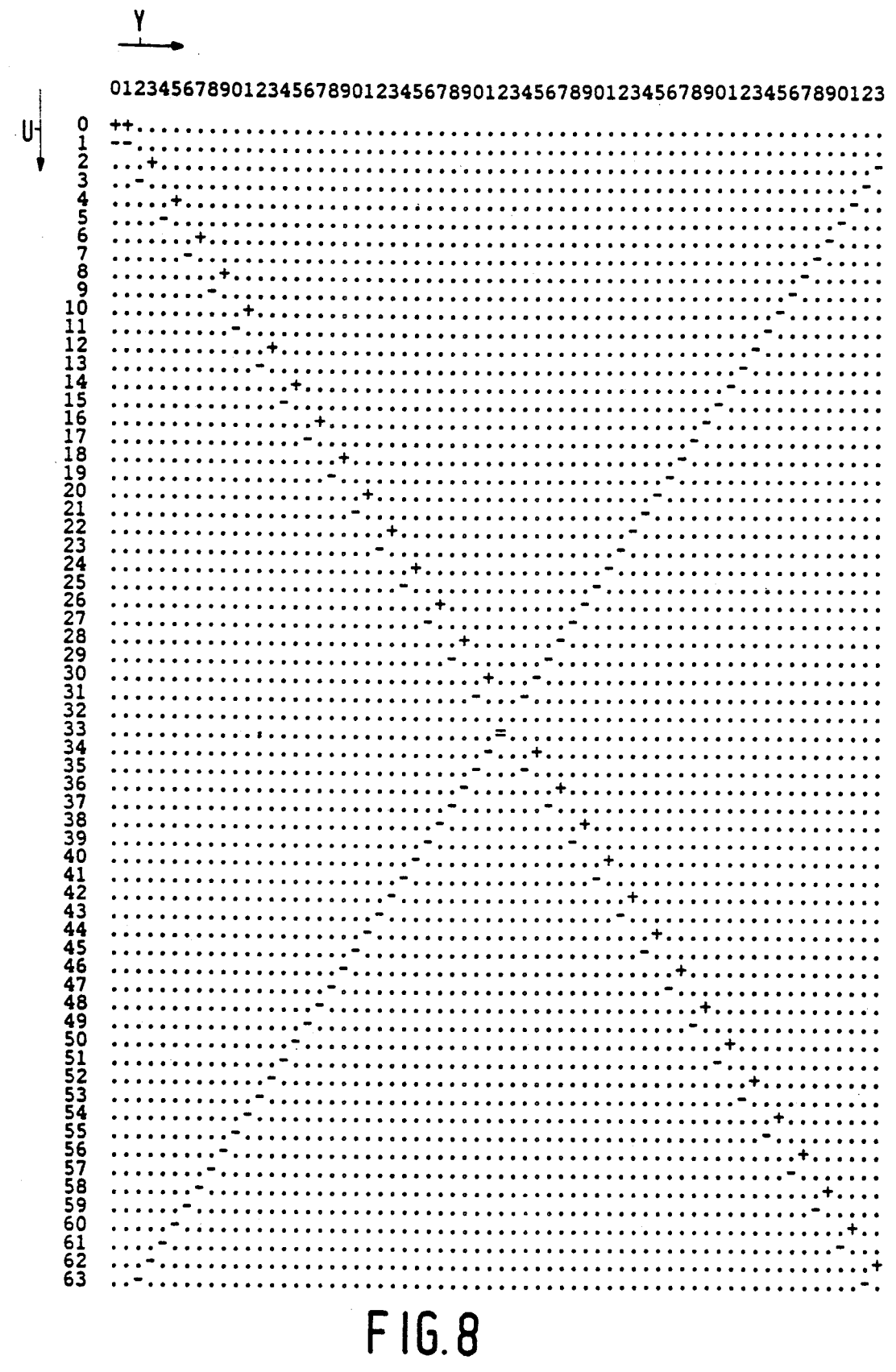

An example of such a matrix [C] can be found in FIG. 8. The example of FIG. 8 is for the situation where M equals 32. The index u runs vertically from the top down to below along the matrix and the index y runs horizontally from left to right along the matrix. The index y of the matrix [C] corresponds to the inputs of the signal processing unit 9, where the index y=0 indicate the most left column in the matrix [C] and corresponds to the input 8.0 of the processing unit 9 and where the index y=(2M−1)=63 indicates the most right column in the matrix [C] and corresponds to the input 8.2M−1 of the processing unit 9.

The index u of the matrix [C] relates to the outputs of the signal processing unit 13, where the index u=0 indicates the top row in the matrix [C] and corresponds to the output 14.0 of the processing unit 13 and where the index u(=2M−1)=63 indicates the bottom row in the matrix [C] and corresponds with the output 14.2M−1 of the processing unit 13.

The dots in the matrix [C] represent coefficients having a value of zero. For one value of u, $u_0$, which is in the present example equal to 32, all coefficients $\phi(u_0,y)$ are zero. For one other value u, $u_1$, which is in the present example equal to 33, all coefficients $\phi(u_1,y)$ are zero except for the coefficient $\phi(u_1,y_0)$, where $y_0$ equals 32 in the present example. This coefficient $\phi(33,32)$ is indicates by means of an "equal to" (=) sign. $\phi(33,32)$ equals the value C.M. where c is a constant, for instance equal to $-1$.

For the remaining $2M-2$ values u $M-1$ separate pairs of values $(u_2,u_3)$ and $M-1$ corresponding separate pairs of values $(y_1,y_2)$ can be found. One example of such corresponding pairs is the corresponding pair of values $(u_2=19, u_3,47)$ and $(y_1=18, y_2=46)$. The coefficients $\phi(19,18)$, $\phi(19,46)$, $\phi(47,18)$ and $\phi(47,46)$ are non zero and represented by means of a "minus" ($-$) sign. The coefficients equal the value c.M/2, or $-M/2$. The coefficients $\phi(19,y)$ and $\phi(47,y)$ for y not equal to 18 or 46, are zero. In the same way the coefficients $\phi(u,18)$ and $\phi(u,46)$ for u not equal to 19 and 47, are zero.

Another example of such corresponding pairs of values are for instance $(u_2=18, u_3=46)$ and $(y_1=19, u_2=47)$. The coefficients $\phi(18,19)$ and $\phi(46,47)$ equal each other and are represented by a "plus" (+) sign. The coefficients equal the value $-cM/2$, or $M/2$. The coefficients $\phi(18,47)$ and $\phi(46,19)$ equal each other and are represented by a minus ($-$) signa and thus equal c.M/2, or $-M/2$. Again another example of such corresponding pairs of values are $(u_2=0, u_3=2)$ and $(y_1=0, y_2=1)$. The coefficients $\phi(0,0)$ and $\phi(0,1)$ equal each other and equal c.M/2, or $-M/2$. The coefficients $\phi(1,0)$ and $\phi(1,1)$ equal each other and equal $-c.M/2$, or $M/2$.

Different from the situation in European Patent Application No. 90.201.369.7 (U.S. Ser. No. 532,465, filed May 31, 1990), where the coefficients of the analysis filters as well as the coefficients of the synthesis filters are derived from the coefficients in the impulse response h(t) of the same standard filter, in the present case only the filter coefficients for the synthesis filters will be derived from the coefficients of the standard filter H(f). And for the further explanation, the coefficients $\phi(u,y)$ for the product matrix [C] will be taken as given in FIG. 8.

Given the coefficients for the synthesis filters and the product matrix [C] it is now possible to derive the coefficients for the analysis filters from the requirement that the total transmission characteristic of the transmission system from the input 1 to output 22 exhibits a frequency independent amplification (or attenuation) and a frequency independent delay.

The method of calculating the coefficients of the analysis filters will be given below.

At this moment, it can be said that the calculation can result in analysis filters having a number of coefficients that can be larger than or smaller than the number of coefficients in the synthesis filters.

Because of the special shape of the product matrix [C], the problem of deriving the coefficients for the analysis filters from the requirement that the total transmission of the system exhibits a frequency independent amplification and a frequency independent delay, can be solved by splitting the problem up into problems of a lower order of complexity. One such partial problem is given in FIG. 9.

One partial problem can be derived from the matrix [C] of FIG. 8 for y having the values 2, 3 and u having the values 2, 3 and 62, 63. The relevant circuit path inside the transmission system is indicated by the circuit within the broken lines forming the block 90.1. A second partial problem is also given in FIG. 9. It relates to the circuit path inside the transmission system indicated by the circuit within the broken lines forming the block 90.2.

In each partial problem a circuit path is given from the input 1, via the commutator 3, a block, such as block 90.1 and the commutator 19 to the output 20.

In a block, such as block 90.1, the terminal 4.1 of the commutator 3 is coupled to the input of the analysis filter 6.1. This analysis filter is coupled to the synthesis filter 16.1 and 16.31 in such a way that the output 7.1a of the analysis filter 6.1 is coupled to the input 15.1b of synthesis filter 16.1 and the input 15.31b of synthesis filter 16.31 via multiplication units that realize a multiplication by a respective factors $\phi(3,2)$ and $\phi(63,2)$. Further the output 7.1b of the analysis filter 6.1 is coupled to the input 15.1a of synthesis filter 16.1 and the input 15.31a of synthesis filter 16.31 via multiplication units that realize a multiplication by respective factors $\phi(2,3)$ and $\phi(62,3)$.

The factors $\phi(2,3)$, $\phi(3,2)$, $\phi(62,3)$ and $\phi(63,2)$ can be obtained from the [C] matrix in FIG. 8.

Figure 9:
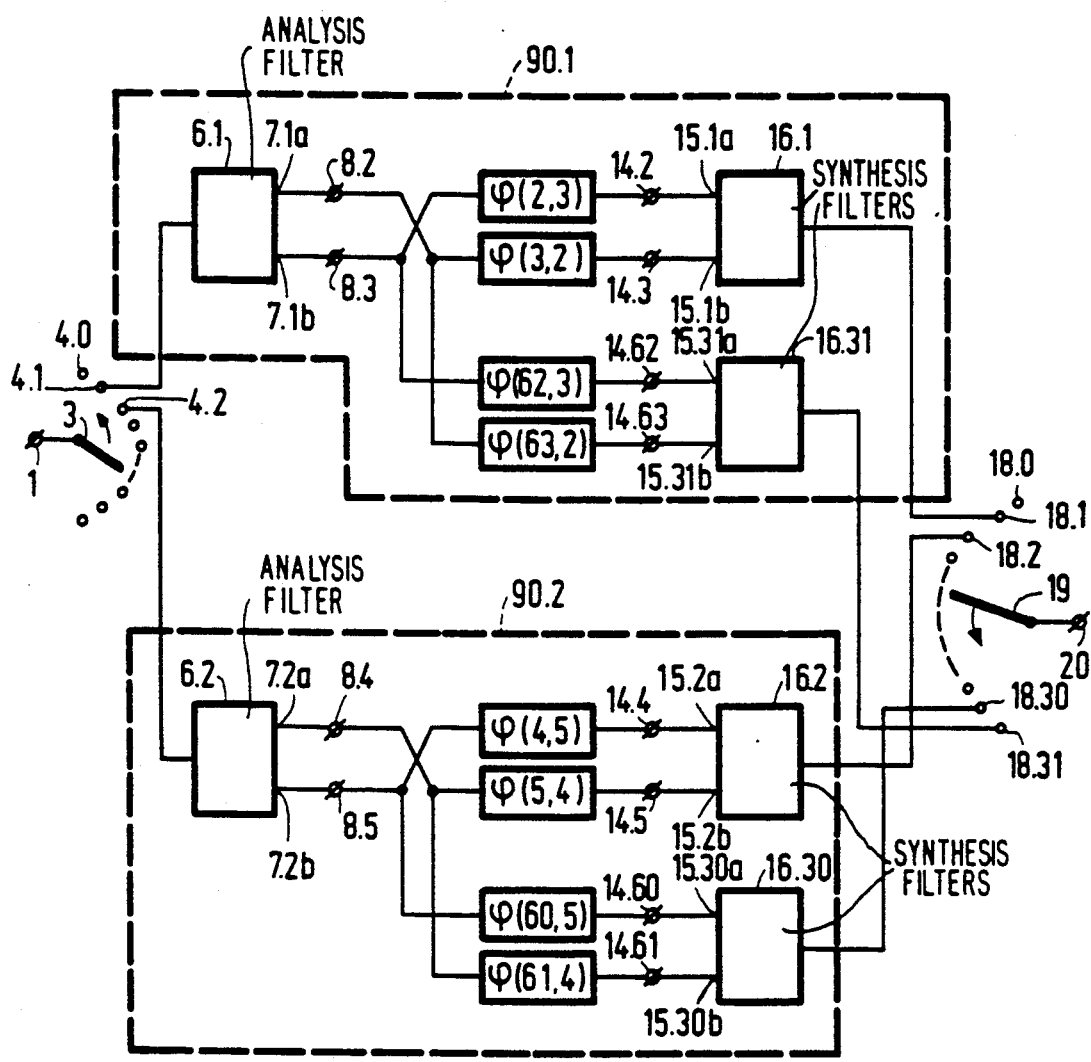

A second partial problem is also given in FIG. 9 and is indicated by the block in broken lines with the reference numeral 90.2. In this block 90.2 the analysis filter 6.2 is coupled to synthesis filters 16.2 and 16.30 in such a way that the output 7.2a is coupled to the input 15.2b of the synthesis filter 16.2 and the input 15.30b of synthesis filter 16.30 via multiplication units that realize a multiplication by respective factors of $\phi(5,4)$ and $\phi(61,4)$. Further the output 7.2b of analysis filter 6.2 is coupled to input 15.2a of synthesis filter 16.2 and the input 15.30a of synthesis filter 16.30 via multiplication units that realize a multiplication by respective factors of $\phi(4,5)$ and $\phi(60,5)$.

The factors $\phi(4,5)$, $\phi(5,4)$, $\phi(60,5)$ and $\phi(61,4)$ can again be obtained from the [C] matrix in FIG. 8.

In this way a total number of M partial problems can be obtained. For all the blocks obtained in this way the requirement exists that an impulse applied to the input 1 of the transmission system and that runs via one block should result in an impulse at the output 20 of the transmission system with a delay and an amplification (or attenuation) factor which are equal for all impulses applied to the input 1 and running via different blocks, such as the two blocks 90.1 and 90.2 in FIG. 9. An example: suppose that two impulses are applied to the input 1 at such time intervals that, when the first impulse which is indicated by the arrow like impulse P1 in FIG. 10a, is applied to the input 1, the commutator 3 couples the input 1 to the terminal 4.2 of the commutator 3, and that when the second impulse which is indicated by the circle on top of the impulse P2 in FIG. 10a, is applied to the input 1, the commutator 3 couples the input 1 to the terminal 4.1 of the commutator 3. The two impulses are thus spaced a time interval $T_1$, see also FIG. 2a, apart.

The impulse $P_1$ is applied to the input of analysis filter 6.2. As can be seen from FIG. 3 this impulse is supplied directly via the multiplication unit 36.1 to the output 35.1, which is the output 7.2a in FIG. 9. Further impulses are repeatedly supplied to this output 7.2a with time spacings of 2T. This is indicated in FIG. 10d: the impulse directly supplied to the output 7.2a being indicated by $y_{4.1}$ and the next impulse, which is delayed by 2T via the delays 32.1 and 32.2 in FIG. 3, being indicated by $y_{4.2}$. It can further be seen from FIG. 3 that the impulse $P_1$ results in impulses at the output 35.2 of the analysis filter, which is the output 7.2b also spaced 2T apart. The first impulse, which is the impulse $y_{5.1}$ in FIG. 10e, being delayed by a time interval T via the delay 32.1, with reference to the impulse $y_{4.1}$, further impulses, such as the impulse $y_{5.2}$ being delayed by the delays 32.2 and 32.3, 32.4 and 32.5, . . . and so on. FIG. 10d and 10e indicate the signals applied to the y=4 and y=5 input respectively of the [C] matrix, which inputs equal the inputs 8.4 and 8.5 input respectively of the processing unit 9.

In the same way the impulse $P_1$ applied to the input 6.1 results in a non delayed impulse $y_{2.1}$ at the output 7.1a and further impulses such as the impulse $y_{2.2}$, see FIG. 10b, spaced 2T apart. The impulse $P_1$ further results in an impulse $y_{3.1}$ at the output 7.1b spaced a time interval T apart from the impulse $y_{2.1}$ and further impulses, such as $y_{3.2}$ spaced time intervals 2T apart from $y_{3.1}$ see FIG. 10c.

FIG. 10f to 10m show the signals present at the outputs u=2, u=3, u=4, u=5, u=60, u=61, u=62 and u=63 of the [C] matrix, which outputs equal the outputs 14.2, 14.3, 14.4, 14.5, 14.60, 14.61, 14.62 and 14.63 respectively of the processing unit 13.

The impulse $y_{2.1}$ present at the input 8.2 of the processing unit results in impulses $u_{3.1}$, see FIG. 10g, and $u_{63.1}$, see FIG. 10m, present at the outputs 14.3 and 14.63 respectively of the processing unit 13. The impulse $y_{4.1}$ present at the input 8.4 of the processing unit 9, results in impulses $u_{5.1}$, see FIG. 10i, and $u_{61.1}$, see FIG. 10k, present at the outputs 14.5 and 14.61 respectively of the processing unit 13. The impulse $y_{3.1}$ present at the input 8.3 of the processing unit 9 results in impulses $u_{2.1}$, see FIG. 10f, and $u_{62.1}$, see FIG. 10l, present at the outputs 14.2 and 14.62 respectively of the processing unit 13. The impulse $y_{5.1}$ present at the input 8.5 of the processing unit 9 results in impulses $u_{4.1}$, see FIG. 10h, and $u_{60.1}$, see FIG. 10j, present at the outputs 14.4 and 14.60 of the processing unit 13.

The same reasoning is valid for the next impulses present at an input of the processing unit 9, such as the impulse $y_{2.2}$, which results in impulses $u_{3.2}$ and $u_{63.2}$.

For the functioning of the transmission system however, it suffices to see how the impulses $u_{2.1}$, $u_{3.1}$, $u_{4.1}$, $u_{5.1}$, $u_{60.1}$, $u_{61.1}$, $u_{62.1}$ and $u_{63.1}$ appear at the output 20.

The impulse $u_{3.1}$ present at the output 14.3 is applied to the input 15.1b of the synthesis filter 16.1. This input is the input 50.2 of the synthesis filter of FIG. 4. This impulse is delayed by a time interval of T in the delay 66.p before it is applied to the output 51, which is coupled to the terminal 18.1 of the commutator 19. The impulse $u_{2.1}$ present at the output 14.2 is spaced a time interval T apart from the impulse $u_{3.1}$ and is applied to the input 15.1a of the synthesis filter 6.1, which is the input 50.1 of the synthesis filter of FIG. 4. This impulse is supplied directly to the output 51 via the multiplication unit 67.p+1. The impulse $u_{3.1}$ delayed by a time interval T is thus added to the impulse $u_{2.1}$ and is supplied to the terminal 18.1 of the commutator 19. This is shown in FIG. 10n, which discloses the impulses present at the various terminals of the commutator 19. The number below the horizontal indicate the indices i of the terminals 18.i of the commutator 19. FIG. 10n shows the impulse indicated by $u_{2.1}+u_{3.1}$ present at the terminal 18.i, with i=1.

In the same way, the impulse $u_{4.1}$ present at the input 15.2a of synthesis filter 16.2, which is the input 50.1 of the synthesis filter in FIG. 4, is supplied directly via the output of the filter to the terminal 18.2 of the commutator 19. The impulse $u_{5.1}$ which comes a time interval T earlier than the impulse $u_{4.1}$, is applied to the input 15.2b, which is the input 50.2 of the synthesis filter of FIG 4. This impulse is delayed by a time interval T in the delay 66.p, so that both impulses $u_{4.1}$ and $u_{5.1}$ add and are supplied to the terminal 18.2. This is indicated in FIG. 10n by means of the arrow like impulse represented by $u_{4.1}+u_{5.1}$, present at the terminal 18.i, with i=2.

In the same way, the impulses $u_{60.1}$ and $u_{61.1}$ present at the inputs 15.30a and 15.30b of the synthesis filter 16.30 are added and supplied to the terminal 18.30 of the commutator 19. This is shown in FIG. 10n by means of the arrow like impulse represented by $u_{60.1}+u_{61.1}$ present at the index i, for i=30.

Also the impulses $u_{62.1}$ and $u_{63.1}$ add in the filter 16.31 and are supplied to the terminal 18.31 of the commutator 19, see the impulse denoted by $u_{62.1}+u_{63.1}$, present at the index i, with i=32.

It should be noted here that the calculators in the transmission system can be carried out at the end of each time interval T, see FIG. 2, in which the commutator 3 has supplied one sample to each of the terminals 4.M−1 to 4.0.

As soon as the commutator 3 has supplied a sample to each of the terminals 4.M−1 to 4.0, then the processing unit 3 has new signals available at all the inputs 8.0 to 8.2M−1, so that the multiplications and summations can be carried out, leading to new output signals available at the outputs 10.0 to 10.M−1.

In the same way, as soon as new signals are available at the inputs 12.0 to 12.M−1 of the processing unit 13 which thus takes place every time interval T, the multiplication and the summations can take place so that new output signals are available at the outputs 14.0 to 14.2M−1.

This thus also means that in each time interval new signals are present at the terminals 18.0 to 18.M−1 of the commutator 19, those new signals remaining present at the outputs during a time interval T until they are replaced by new signals.

Because of the fact that the commutator 19 connects all the terminals 18.0 to 18.M−1, in this order, after each other to the output 20 during each time interval T, the signals disclosed in FIG. 10n as a function of the terminal index i, also indicate the signals as a function of time that occur during that time interval T at the output 20.

This means that when two impulses $P_1$ and $P_2$, see FIG. 10a, are applied to the input 1 of the system, four impulses will occur at the output 20.

Two of them, namely the impulses indicated by $u_{2.1}+u_{3.1}$ and $u_{4.1}+u_{5.1}$ occur in the reverse order compared to the impulses $P_1$ and $P_2$. This can easily be seen when comparing FIG. 10a with FIG. 10n: the arrow like impulse $P_1$ in FIG. 10a comes first, whereas the arrow like impulse $u_{4.1}+u_{5.1}$ in FIG. 10n, which is the result of the arrow like impulse $P_1$, comes second. Those two impulses thus do not meet the requirement that impulses transmitted via two blocks, such as the blocks 90.1 and 90.2 in FIG. 9, should have the same delay. The conclusion should thus be that the impulses $u_{2.1}+u_{3.1}$ and $u_{4.1}+u_{5.1}$ are distortion components.

The other two impulses $u_{60.1}+u_{61.1}$ and $u_{62.1}+u_{63.1}$ occur in the correct order at the output 21, compared to the occurrence of the impulses $P_1$ and $P_2$ at the input. The arrow like impulse $u_{60.1}+u_{61.}$ in FIG. 10n results from the arrow like impulse $P_1$ in FIG. 10a and the impulse $u_{62.1}+u_{63.1}$ in FIG. 10n results from the impulse P2 in FIG. 10a. There is a certain delay, see FIG. 10n, which is equal for both impulses. The conclusion should thus be that the impulses $u_{60.1}+u_{61.1}$ and $u_{62.1}+u_{63.1}$ are the correct output signals that should result when impulses P1 and P2, as given in FIG. 10a are supplied to the input 1.

When going back to FIG. 8, it will be clear from the foregoing that the non-zero coefficients in the diagonal from top right to bottom left in the matrix realize the correct transfer, whereas the non-zero coefficients in the diagonal form top left to bottom right in the matrix result in a distortion component.

The derivation of the coefficients of the analysis filters, going out from the coefficients of the matrix [C] of FIG. 8 and the coefficients of the synthesis filters as derived from the standard filter H(f), see the description with reference to FIG. 7, can now be specified more accurately by the requirement that the coefficients of the analysis filters should be chosen such that an impulse applied to the input 1 that runs via a block, such as block 90.1 in FIG. 9, should result in one single impulse of the output 20, the said single impulse resulting from the data route via the coefficients in the diagonal form top right to bottom left in the [C] matrix, whereas the data route via the coefficients in the diagonal form top left to bottom right in the [C] matrix would lead to no output signal at the output 21, in response to the said single impulse applied to the input 1.

The requirements given above will first be applied to the combination of the analysis filter 6.0 and the synthesis filter 16.0, because this combination is a special case, see the [C] matrix of FIG. 8. This combination is disclosed in FIG. 12a. The input signal to the filter 6.0 is one impulse in the signal $U_0$ given in FIG. 2i. This signal can be described as $I_0(k)=\delta(k)$, where k is the index of one block of consecutive blocks of length T. This means that one impulse is applied to the input for $k=0$.

The output signal $J_{0.a}(k)$ at the output 7.0a of filter 6.0 can be written as:

$$J_{0.a}(2k) = \sum_{i=0}^{(n-1)/2} a_0(2i)I_0(2k-2i) = a_0(2k) \text{ and} \quad \text{(eq. 1.1)}$$

$$J_{0.a}(2k+1) = 0$$

The output signal $J_{0.b}(k)$ at the output 7.0b of filter 6.0 can be written as:

$$J_{0.b}(2k+1) = \sum_{i=0}^{(n-1)/2} a_0(2i+1)I_0(2k+1-2i-1) = \quad \text{(eq. 1.2)}$$

$$a_0(2k+1)$$

and $J_{0.b}(2k) = 0$

The output signal $K_{0.a}(k)$ at the output 14.0 of the [C] matrix can be written as:

$$K_{0.a}(k) = \phi(0,0).J_{0.a}(k) + \phi(0,1)J_{0.b}(k) = a_0(k).M/2 \quad \text{(eq. 2.1)}$$

The output signal $K_{0.b}(k)$ at the output 14.1 of the [C] matrix can be written as:

$$K_{0.a}(k) = \phi(1,0).J_{0.a}(k) + \phi(1,1)J_{0.b}(k) = -a_0(k).M/2 \quad \text{(eq. 2.2)}$$

The output signal $L_0(k)$ at the output 17.0 of synthesis filter 16.0 can now be written as:

$$\begin{aligned} L_0(k) &= \sum_{i=0}^{(p-1)/2} b_0(2i)K_{0.a}(k-2i) + \sum_{i=0}^{(p-1)/2} b_0(2i+1)K_{0.b}(K-2i-1) \\ &= \sum_{i=0}^{(p-1)/2} b_0(2i)a_0(k-2i)M/2 - \sum_{i=0}^{(p-1)/2} b_0(2i+1).a_0(k-2i-1)M/2 \\ &= \frac{M}{2} \sum_{i=0}^{p} b_0(i)a_0(k-i)(-1)^i \end{aligned} \quad \text{(eq. 3)}$$

The requirement given previously now leads to the following equations:

$L_0(k)=0$ for $k=0,1,2,\ldots,D-1,D+1,\ldots n+p$ $L_0(k)=1$ for $k=D$

The equation $L_0(k)=1$ for $k=D$ means that the response of the system on an impulse in a block $k=0$ and applied to the input of the filter 6.0 will be an impulse in the block $k=D$ that appears at the output of the filter 16.0.

The number of equations for $L_0(k)$ is $n+p+1$, whereas there are $n+1$ unknows $a_0(0)$ to $a_0(n)$, being the coefficients in the analysis filter 6.0.

By means of a standard optimization procedure the optimal values for the coefficients $a_0(0)$ to $a_0(n)$ can be obtained.

Figure 10:
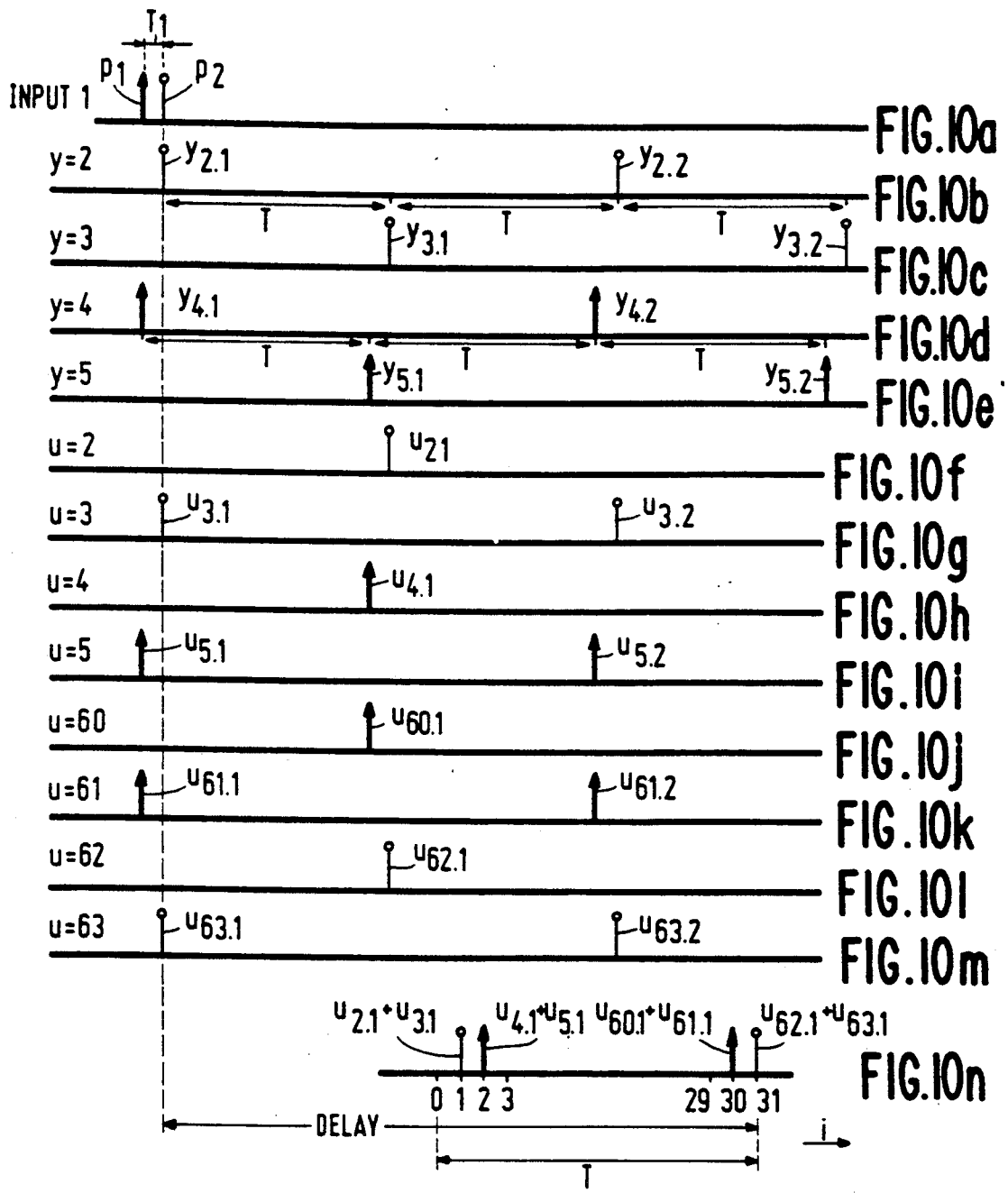
Figure 11:
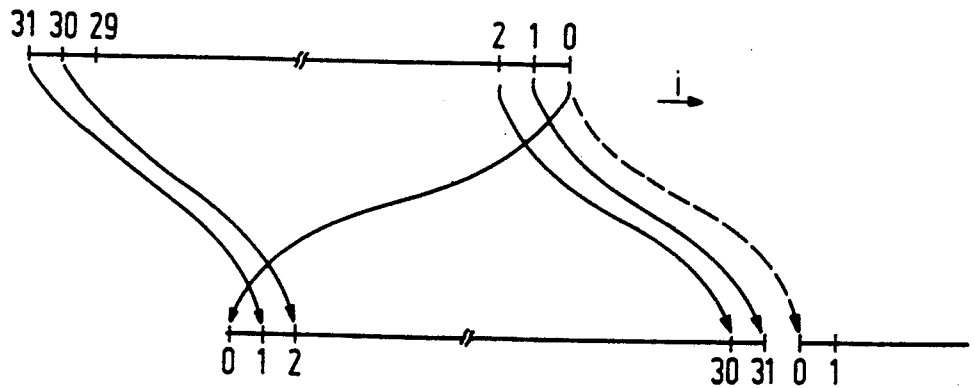

At this moment there is a need to discuss the delay between the impulses applied to the input 1 of the transmitter that run via the various analysis filters and corresponding synthesis filters, and become the impulse appearing at the output 21 of the receiver. In FIG. 10 it has been made clear that an impulse applied to the input 1 which runs via the analysis filter 6.M−1, which is in that example analysis filter 6.31, appears at the output 17.1 of synthesis filter 16.1 and that an impulse applied to the input 1 that runs via the analysis filter 6.M−2, which is analysis filter 6.30, appears at the output 17.2 of synthesis filter 16.2. This goes on for analysis filters having a decreasing index and synthesis filters having an increasing index. This means that an impulse applied to the input 1 which runs via the analysis filter 6.2 appears at the output 17.30 of synthesis filter 16.30 and that an impulse applied to the input 1 which runs via the analysis filter 6.1 appears at the output 17.31 of synthesis filter 16.31. This has been made clear in FIG. 11. The top horizontal line indicate the indices i of the outputs 4.i of the means 3 on which subsequent impulses in a block of 32 impulses applied to the input 1 appear after each other in time. The lower horizontal line indicates the indices j of the inputs 18.j of the means 19. The arrows linking an index on the top horizontal line with an index on the lower horizontal line indicate how the transmission system feeds the impulses applied to the outputs 4.i to the inputs 18.i. As can be seen in FIG. 11 the transmission of the impulse appearing at the output 4.0 of the means 3 is a special case, in that it comes one block too early, see the line linking the index i=0 with the index j=0 in FIG. 11.

In order to account for this the delay through the system of the impulse appearing at the output 4.0 of the means 3, which has been assumed previously to be equal to D blocks, should be one block longer than the delay of the other impulses through the system. This brings the impulse appearing at the output 4.0 in the correct sequence at the output 21 of the system, see the broken line linking the index i=0 with the index j=0 of the next block on the lower horizontal line.

The knowledge obtained will be used in the further calculations of the transmission of the various impulses through the system.

Next the calculations will be carried out on the transmission of an impulse that runs from the input 1 to the output 21 via the combination of the analysis filter 6.16 and synthesis filter 16.16. This combination is also a special case, see the [C] matrix of FIG. 8. This combination is disclosed in FIG. 12b.

The input signal to the filter 6.16 is one impulse and can be described as $I_{M/2}(k) = \delta(k)$. It should be noted that a more general situation will be used where 16 equals M/2. The output signal $J_{M/2.a}(k)$ at the output 7.16a of filter $$6 \cdot \frac{M}{2}$$

can be written as:

$$J_{M/2.a}(2k) = a_{M/2}(2k) \text{ and } J_{M/2.a}(2k+1) = 0 \quad \text{(eq. 4.1)}$$

The output signal $J_{M/2.b}(k)$ at the output 7.16b of filter $$6 \cdot \frac{M}{2}$$

can be written as:

$$J_{M/2.b}(2k+1) = a_{M/2}(2k+1) \text{ and } J_{M/2.b}(2k) = 0 \quad \text{(eq. 4.2)}$$

The output signal $K_{M/2.a}(k)$ at the output 14.32 of the [C] matrix can be written as:

$$K_{M/2.a}(k) = 0 \quad \text{(eq. 5.1)}$$

The output signal $K_{M/2.b}(k)$ at the output 14.33 of the [C] matrix can be written as:

$$K_{M/2.b}(2k) = -M \cdot a_{M/2}(2k) \text{ and } K_{M/2.b}(2k+1) = 0 \quad \text{(eq. 5.2)}$$

The output signal $L_{M/2}(k)$ at the output 17.16 of the synthesis filter 16.16 can now be written as follows:

$$L_{M/2}(2k+1) = \quad \text{(Eq. 6)}$$

$$-M \sum_{i=0}^{(p-1)/2} b_{M/2}(2i+1) a_{M/2}(2k-2i) \text{ and } L_{M/2}(2k) = 0$$

The requirement given previously now leads to the following equations $$L_{M/2}(2k+1) = 0 \text{ for } k = 0, 1, 2, \ldots,$$

$$\frac{D}{2} - 2, \frac{D}{2}, \frac{D}{2} + 1, \ldots \frac{n+p}{2} - 1$$

-continued $$L_{M/2}(2k+1) = L_{M/2}(D-1) = 1 \text{ for } k = \frac{D}{2} - 1$$

The number of those equations is (n+p)/2 whereas there are (n+1)/2 unkowns $a_{M/2}(0)$, $a_{M/2}(2)$, $a_{M/2}(4)$, ..., $a_{M/2}(n-1)$.

By means of the already mentioned standard optimization procedure the optimal values for the coefficients $a_{M/2}(0)$, $a_{M/2}(2)$, $a_{M/2}(4)$, ... can be obtained.

The other (n+1)/2 unkowns $a_{M/2}(1)$, $a_{M/2}(3)$, $a_{M/2}(5)$, ... $a_{M/2}(n)$ remain undetermined. This because of the fact that one row (u=32) and one column (y=33) in the matrix of FIG. 8 have only zero coefficients.

Figure 12A:
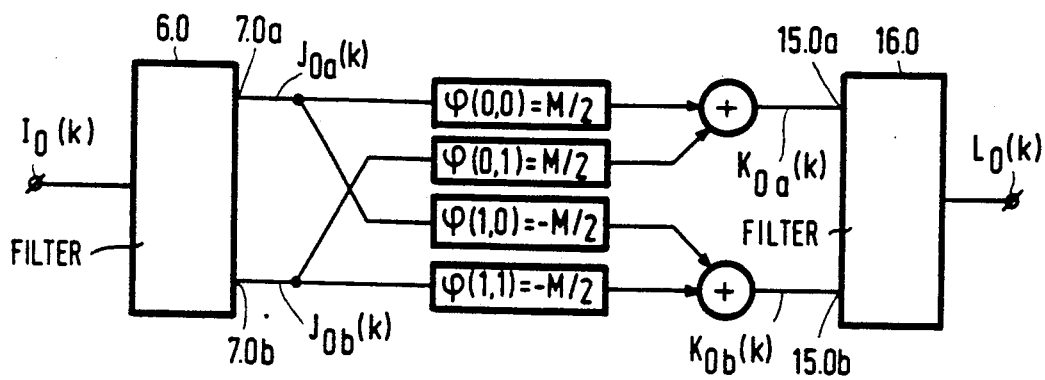
Figure 12B:
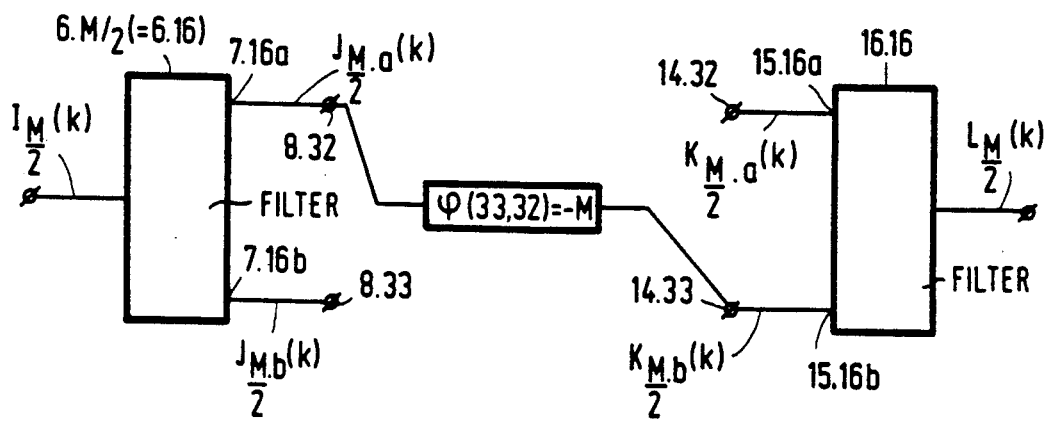

From FIG. 12b it becomes clear that the coefficients $a_{M/2}(1)$, $a_{M/2}(3)$, $a_{M/2}(5)$, ... need not to be determined at all. This for the reason that those coefficients lead to an output signal at the output 7.16b of the filter 6.M/2 that is not used in the further transmission. The terminal 7.16b is in fact an open terminal. This means that the filter 6.M/2 can be simplified by leaving out those filter elements that realize the multiplications with the coefficients $a_{M/2}(1)$, $a_{M/2}(3)$, $a_{M/2}(5)$, ... etc. including the adder unit 33 and further leaving out the output 7.16b. Consequently, this filter has only one output, compared to the other filters that have two outputs each. In the same way the input 8.33 of the signal processing unit 9 can be left out including those elements in the unit 9 that realize the multiplications by $\alpha(x,33)$.

In the same way FIG. 12b makes clear that the output 14.32 of the signal processing unit 13 can be left out, as well as those elements in the input 13 that realize the multiplications by $\beta(32,v)$. Moreover, the input 15.16a of the filter 16.16 can be left out, as well as the elements in the filter 16.16 (=16 M/2) that realize the multiplication by $b_{M/2}(0)$, $b_{M/2}(2)$, $b_{M/2}(4)$, ... etc, as well as their corresponding adder units.

The requirements given previously will now be applied to the other analysis and synthesis filters. This means that the calculation as given above for the combinations of analysis and synthesis filters as disclosed in the FIGS. 12a and 12b, will be applied to the combinations, such as the one given in block 90.1 in FIG. 9.

That calculation is as follows.

The input signal to a filter 6.m, such as the filter 6.1 in FIG. 9, is given by $I_m(k) = \delta(k)$.

The output signal $J_{m.a}(k)$ at the output 7.m.a. of this filter is $$I_{m.a}(2k) = a_m(2k) \text{ and } I_{m.a}(2k+1) = 0 \quad \text{(eq. 8.1)}$$

The output signal $I_{m.b}(k)$ at the output 7.m.b. of this filter is $$I_{m.b}(2k+1) = a_m(2k+1) \text{ and } I_{m.b}(2k) = 0 \quad \text{(eq. 8.2)}$$

The output signal $K_{m.a}(k)$ at the output 14.2m of the [C] matrix is $K_{m.a}(2k+1) = a_m(2k+1) \cdot M/2$ and $K_{m.a}(2k) = 0$ The output signal $K_{m.b}(k)$ at the output 14.2m+1 of the [C] matrix is $K_{m.b}(2k) = -a_m(2k) \cdot M/2$ and $K_{m.b}(2k+1) = 0$ The output signal $K_{M-m.a}(k)$ at the output 14.2M−2m of the [C] matrix is $K_{M-m.a}(2k+1) = -a_m(2k+1) \cdot M/2$ and $K_{M-m.a}(2k) = 0$ The output signal $K_{M-m.b}(k)$ at the output 14.2M−2m+1 of the [C] matrix is $K_{M-m.b}(2k) = -a_m(2k) \cdot M/2$ and $K_{M-m.b}(2k+1) = 0$ The output signal of the synthesis filter 16.m which is $L_m(k)$, i distortion term.

This term equals $$L_m(k) = \sum_{i=0}^{(p-1)/2} b_m(2i)K_{m,a}(k-2i) + \sum_{i=0}^{(p-1)/2} b_m(2i+1)k_{m,b}(k-2i-1)$$

or (a) $L_m(2k) = 0$ (b) $L_m(2k+1) = M/2 \sum_{i=0}^{(p-1)/2} b_m(2i)a_m(2k-2i+1) - b_m(2i+1)a_m(2k-2i)$ $= M/2 \sum_{i=0}^{p} b_m(i)a_m(2k+1-i)(-1)^i$ The output signal of the synthesis filter $16.M-m$ is $L_{M-m}(k)$. This term equals:

$$L_{M-m}(k) = \sum_{i=0}^{(p-1)/2} b_{M-m}(2i)K_{M-m,a}(k-2i) + \sum_{i=0}^{(p-1)/2} b_{M-m}(2i+1)K_{M-m,b}(k-2i-1)$$

or (a) $L_{M-m}(2k) = 0$ (b) $L_m(2k+1) = M/2 \sum_{i=0}^{(p-1)/2} \{-b_{M-m}(2i)a_{M-m}(2k-2i+1) - b_m(2i+1)a_{M-m}(2k-2i)\}$ $= M/2 \sum_{i=0}^{p} b_{M-m}(i)a_m(2k+1-i)$ The requirements given previously now leads to the following equations:

$L_m(2k+1) = 0$ for $k = 0$ until and including $\frac{n+p}{2} - 1$ $L_{M-m}(2k+1) = 0$ for $k = 0,1,2,\ldots \frac{D}{2} - 2, \frac{D}{2}$, $\frac{D}{2} + 1, \ldots, \frac{n+p}{2} - 1 L_{M-m}(D-1) = L_{M-m}(D-1) = 1$ for $k = \frac{D}{2} - 1$ The number of those equations is $n+p$, whereas there are $n+1$ unknowns $a_m(0), a_m(1), \ldots, a_m(n)$. By means of the already mentioned standard optimization procedure the optimal values for those coefficients can be obtained. The above calculation can be carried out a number of times in order to obtain the coefficients in the other analysis filters $6.m$, where m runs from 1 to $\frac{M}{2} - 1$ and from $\frac{M}{2} + 1$ to $M - 1$ inclusive.

With the calculations given in the foregoing it is thus possible to calculate the required coefficients for the analysis filters. The calculations given in the foregoing can be characterized by the statement that the coefficients for the analysis filters are specially adapted to the coefficients of the synthesis filters chosen, such that a transmission characteristic is obtained that as good as possible approximates a frequency independent delay and a frequency independent amplification factor for the total transmission system.

Figures 13, 14:
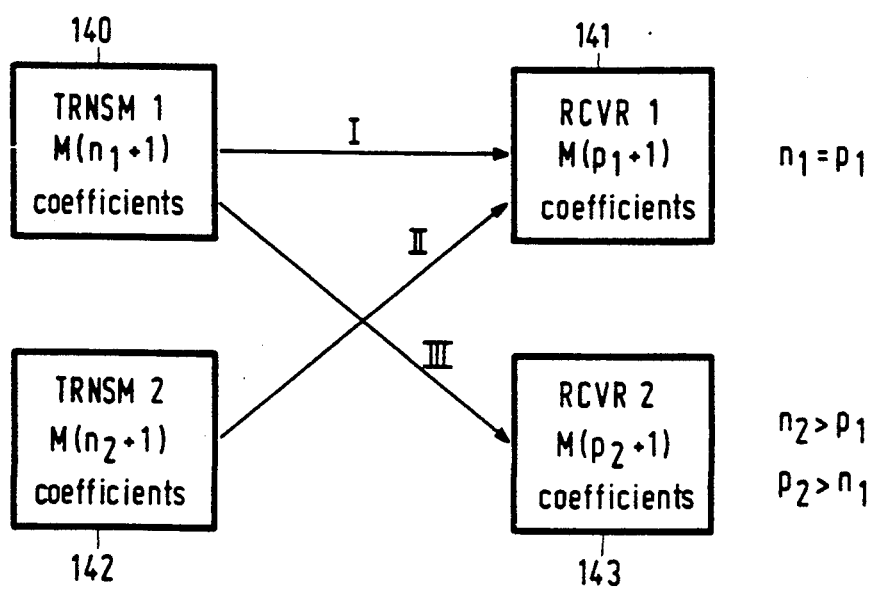

FIG. 13 shows distortion results for a number of transmission systems. In all transmission systems the synthesis filters have remained the same. The synthesis filters have a length (a number of coefficients) of 16. That means that the value p in FIG. 4 equals 15. The length of the standard filter H(f) of FIG. 6a, that is the number of impulse coefficients of the standard filter, equals 511. That means that the standard filter H(f) has an odd number of coefficients, whereas the synthesis filters need $32 \times 16 = 512$ coefficients. In European Patent Application No. 90.201.369.7 (U.S. Ser. No. 532,465, filed May 31, 1990) it is explained how the 512 coefficients can be derived from the impulse response of the standard filter, namely by adding one impulse (and thus one coefficient) of value zero.

The distortion in the table has been calculated using the formula $$10.\ ^{10}\log \left( 1/M \sum_{m=0}^{M-1} \sum_k \{ir(k) - dir(k)\}^2 \right)$$

with ir(k) the real impulse response of the transmission system and dir(k) the desired impulse response. The distortion is given in decibels.

As can be seen for all possible transmission systems the best result can be obtained for such a delay where D equals the sum of the length of an analysis filter and a synthesis filter divided by 2, or $$D = \frac{n+p+2}{2}.$$

It should be noted here that transmission systems with an equal number of coefficients for the analysis filters and the synthesis filters are described in the previously mentioned European Patent Application No. 90.201.369.7 (U.S. Ser. No. 532,465, filed May 31, 1990).

The table in FIG. 13 indicates that when the analysis filter have the same length as the synthesis filters, which is a length of 16, a distortion value will be obtained of −85 dB with D=16. This distortion value results from deviations from a flat frequency response and from a linear phase response and results from aliasing.

The table in FIG. 13 further indicates that by increasing the number of coefficients in the analysis filters, to a number larger than the number of coefficients in the synthesis filters, an even lower distortion can be obtained.

This behaviour has advantages in many applications. In broadcast applications as well as recording applications, especially the play-back of recorded tapes and optical discs in (portable) play-back only apparatus, by making the analysis filters having more coefficients than the synthesis filters, the circuit complexity can be shifted towards the transmitter side and the receiver can become relatively simple.

This means that the receivers can have a lower power consumption and can be made cheaper.

We can summarize the results as follows. In FIG. 14 a transmission system I is disclosed comprising the transmitter 1 with reference numeral 140 and the receiver 1 with reference numeral 141. The M analysis filters in the transmitter 140 each comprise $n_1+1$ filter coefficients and the synthesis filters in the receiver 141 each comprise $p_1+1$ filter coefficients. $n_1$ equals $p_1$. The coefficients of the filters in the transmitter, as well as the receiver are both derived as given in European Patent Application No. 90.201.369.7 (U.S. Ser. No. 532,465, filed May 31, 1990). That is: the coefficients for the filters in the transmitter and the receiver are both derived from the same standard filter, having a number of impulses which equals $M(n_1+1)$ or $M(n_1+1)-1$. A certain transmission quality can be obtained for this transmission system I.

In FIG. 14 an other transmission system II is disclosed comprising the transmitter with reference numeral 142 and the receiver 141. The M analysis filters in the transmitter 2 each comprise $n_2+1$ filter coefficients, where $n_2 > p_1$. The filter coefficients of the analysis filters of transmitter 142 have been obtained in the way as disclosed hereinbefore. This means that the filter coefficients of the analysis filters of transmitter 142 are specially adapted to the filter coefficients of the synthesis filters of receiver 141. The transmission system II comprising the transmitter 142 and the receiver 141 realize an improved transmission quality compared to the transmission system I, as has been explained in the foregoing.

FIG. 14 discloses again another transmission system III, comprising the transmitter 140 and a receiver 143. This receiver 143 has M synthesis filters, each synthesis filter having $p_2+1$ filter coefficients, where $p_2 > n_1$.

In this transmission system the coefficients of the analysis filters in the transmitter 1 are derived from the standard filter H(f) and thus known and the coefficients of the synthesis filters in the receiver 2 should be determined by means of a calculation procedure equivalent to the one given hereinbefore. This means that the filter coefficients of the synthesis filters of receiver 143 are specially adapted to the filter coefficients of the analysis filters in the transmitter 140. This also leads to an improved transmission quality for the transmission system III compared to the transmission system I. If $p_2$ equals $n_2$ the transmission quality of the transmission systems II and III are about the same.

If however the transmitter 142 and the receiver 143 would have been coupled together, such transmission system would have a lower transmission quality than the transmission systems II and III, even in the case that $n_2$ equals $p_2$. This because of the fact that transmitter 142 and receiver 143 are not adapted to each other.

The conclusion should thus be that the transmission systems according to the invention, that are the transmission systems II and III, realize a better transmission quality than the transmission quality of the transmission system I, in spite of the fact that the transmission system II includes the receiver 141 of the transmission system I and that the transmission system III includes the transmitter 140 of transmission system I. This means that an improvement can be obtained by increasing the circuitry complexity either at the transmitter side (transmission system II) or at the receiver side (transmission system III).

With the invention a number of possible applications can be foreseen.

One can think of a transmission system where only the transmitter, such as the transmitter 140 is present, whereas two kinds of receivers are commercially available. The one receiver is the receiver 141, which can be considered to be a receiver for the low end market, and the second receiver being the receiver 143, which can be considered to be a high end version receiver. Consumers now have the possibility of buying either a cheap receiver (the receiver 141) or a more expensive receiver (the receiver 143). In this way consumers can decide on buying the reception (or reproduction) quality they want.

A second possibility is, that only one receiver, such as the receiver 141 is commercially available, whereas two transmitters are present at the transmitter side, namely the transmitter 140 and the transmitter 142. The broadcasting authority can now decide on whether to transmit signals via the transmitter 140, or via the transmitter 142, so that reception at the receiver side is either with a low or with an improved signal quality. The same can of course be done in producing prerecorded tapes or discs.

Figures 15, 16:
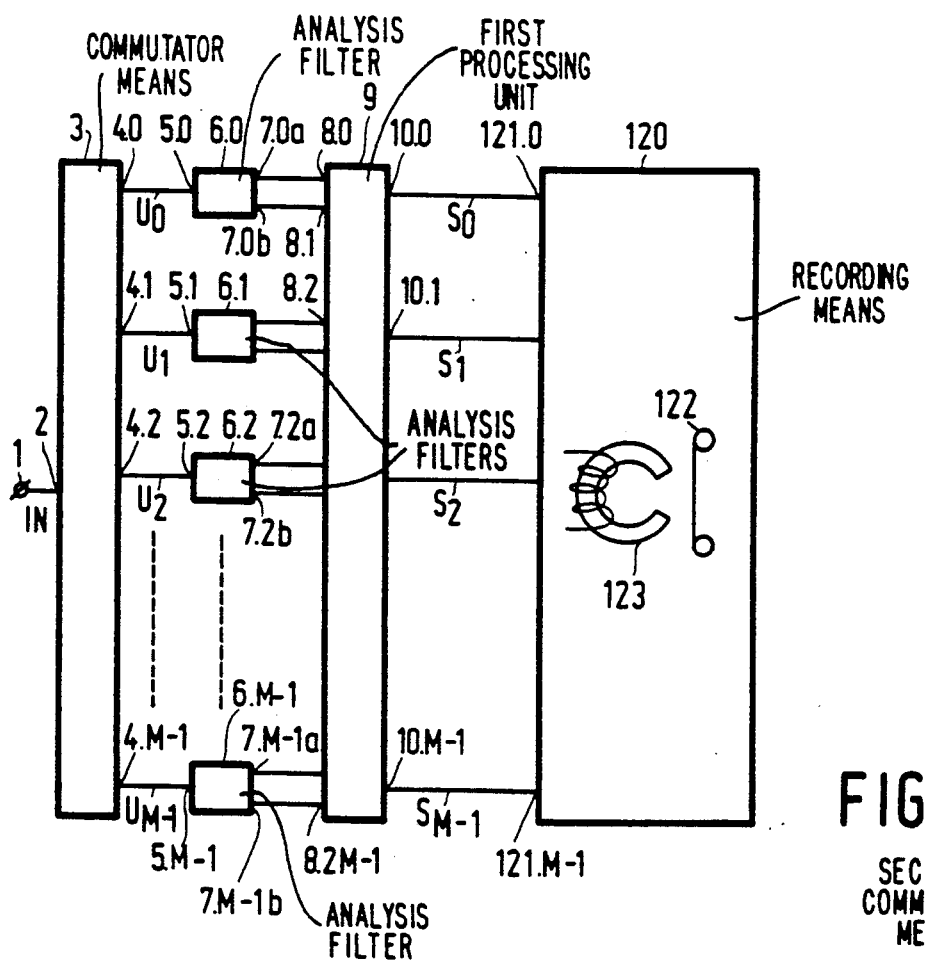

FIGS. 15 and 16 show a transmission via magnetic record carriers. FIG. 15 shows a digital signal recording apparatus, which includes the transmitter as shown in FIG. 1. The apparatus further includes recording means 120 having M inputs 121.0 to 121.M−1, each one coupled to a corresponding one of the M outputs of the signal processing unit 9. The apparatus is for recording a digital audiosignal to be applied to the input 1 on a magnetic record carrier 122 by means of at least one magnetic recording head 123.

The recording means 120 can be an RDAT type of recording means, which uses the helical scan recording principle to record the signal $s_0$ to $s_{M-1}$ in slant tracks lying next to each other on the record carrier, in the form of a magnetic tape. In that case it might be necessary for the recording means 120 to incorporate means to realize a parallel-to-serial conversion on the signal applied to the inputs 121.1 to 121.M−1.

The recording means 120 can equally well be an SDAT type of recording means, in which the signals $s_0$ to $s_{m-1}$ to be recorded are divided over a number of tracks, the said number of tracks not necessarily being equal to M, lying in parallel on, and in the length direction of the record carrier. Also in this case it might be necessary to realize parallel-to-serial conversion on the signals, e.g. if the number of tracks is less than M.

RDAT and SDAT type of recording means are well known in the art and can e.g. be found in the book "The art of digital audio" by J. Watkinson, Focal press, London, 1988. Therefore no further explanation is needed.

FIG. 16 shows a digital reproduction apparatus, which includes the receiver as shown in FIG. 1. The apparatus further includes reproducing means 124 having M outputs 125.0 to 125.M−1, each one coupled to one of the inputs 12.0 to 12.M−1 of the other signal processing unit 13.

The apparatus is for reproducing the digital signal, as it is recorded on the record carrier 122 by means of the apparatus of FIG. 15. Therefore the reproducing means 124 comprise at least one read head 126. The reproducing means can be an RDAT or SDAT type reproducing means. For a further explanation of the reproducing means in the form of an RDAT or SDAT type reproducing means, reference is made to the previously mentioned books of J. Watkinson.

The analysis filters in the recording apparatus of FIG. 15 can have a number of filter coefficients that is larger than the number of coefficients in the synthesis filters in the reproducing apparatus. If the reproducing apparatus of FIG. 16 is incorporated in a playback only apparatus, such apparatus can then be made less expensive and require a lower power consumption.

Another possibility is that the number of filter coefficients in the recording apparatus is smaller than the number of coefficients in the synthesis filters in the reproducing apparatus.

Apparatuses for recording and reproducing a digital audio signal in/from a record carrier comprise a combination of the recording apparatus of FIG. 15 and the reproducing apparatus of FIG. 16.

In that case the recording and reproducing apparatus comprise M analysis filters on the recording side and M synthesis filters at the reproducing side, the analysis filters having a number M(n+1) coefficients and the synthesis filters having a number of M(p+1) coefficients, the number of coefficients in the analysis filters not being equal to the number of coefficients in the synthesis filters.

It should be noted that the invention is not limited to the embodiments disclosed herein. The invention equally applies to those embodiments which differ from the embodiments shown in respect which are not relevant to the invention. As an example, the present invention can be equally well applied in apparatuses such as they are described in the not yet published Netherlands Patent Applications 88.02.769 (PHN 12.735) and 89.01.032 (U.S. Ser. No. 433,631, filed Nov. 8, 1989) in which at least two signals are combined into a composite signal, are transmitted, and are split up in at least two signals at the receiver side. Further all the calculations can be carried out in software, using a microprocessor, programmed in the correct way. This means that the transmitter as well as the receiver can be provided with a microprocessor that carries out the filterings and signal processing in software.

I claim:

1. A digital transmission system having a transmitter and a receiver, the transmitter including a coder for subband coding of a digital signal, having a given sampling rate $F_S$, and the receiver including a decoder for decoding the subband coded signal, the coder being responsive to the digital signal, for generating a number of M sub-band signals with sampling rate reduction, the coder dividing the digital signal band into successive subbands of band numbers $m(0 \leq m \leq M-1)$ increasing with frequency, the subbands having approximately equal bandwidths, the decoder being responsive to the M subband signals for constructing a replica of the digital signal, this decoder merging the subbands to the digital signal band, with sampling rate increase, the coder comprising analysis filter means and a first signal processing unit, the analysis filter means comprising M analysis filters, each having one input and two outputs, the 2M outputs of the filters being coupled to 2M outputs of the analysis filter means for supplying 2M output signals with a sampling rate $F_S/M$, each analysis filter being adapted to apply two different filterings on the signal applied to its input and to supply each of the two different filtered versions of that input signal to a corresponding one of the two outputs, each one of the two filter outputs being coupled to a corresponding one of 2M inputs of the first signal processing unit, the first processing unit having M outputs coupled to M outputs of the coder for supplying the M subband signals, the first signal processing unit being adapted to supply output signals on each of M outputs, an output signal being a combination of at least a number of input signals applied to its 2M inputs, the decoder comprising a second signal processing unit and synthesis filter means, the second signal processing unit having M inputs for receiving the M subband signals and having 2M outputs, the synthesis filter means comprising M synthesis filters each having 2 inputs, and one output coupled to the decoder output, the second signal processing unit being adapted to generate an output signal on each of its 2M outputs, an output signal being a combination of at least a number of input signals applied to its M inputs, each pair of outputs of the second signal processing unit being coupled to a pair of two inputs of a corresponding one of the M synthesis filters, each synthesis filter having one output, each synthesis filter being adapted to apply different filterings on the two signals applied to the two inputs and to supply a combination of the two filtered signals to its output, each output can be coupled to the output of the synthesis filter means for supplying the replica of the digital signal having a sampling rate $F_S$, the coefficients of the analysis or the synthesis filters being derived from the coefficients of a standard filter having a low pass filter characteristic with a bandwidth approximately equal to half the bandwidth of the subbands, $\alpha(x,y)$ in a M×2M coefficient matrix A being the multiplication coefficient in the first processing unit, with which the input signal applied to the y-th of the 2M inputs of the first processing unit is multiplied before it is applied to the x-th of the M outputs of the first processing unit, $\beta(u,v)$ in a 2M×M coefficient matrix B being the multiplication coefficient in the second processing unit, with which the input signal applied to the v-th of the M inputs of the second processing unit is multiplied before it is applied to the u-th of the 2M outputs of the second processing unit, wherein the coefficients $\alpha(x,y)$ and $\beta(u,v)$ are chosen such that, if coefficients $\phi(u,y)$ in a 2M×2M coefficient matrix C are calculated in accordance with the following formula $$\phi(u,y) = \sum_{i=0}^{M-1} \beta(u,i)\alpha(i,y)$$

from the coefficients $\alpha(x,y)$ and $\beta(u,v)$, a number of at least two separate pairs of values $(u_2,u_3)$ and corresponding separate values $(y_1,y_2)$ are present for which the coefficients $\phi(u_2,y_1)$, $\phi(u_2,y_2)$, $\phi(u_3,y_1)$ and $\phi(u_3,y_2)$ are non zero, the coefficients $\phi(u_2,y)$ and $\phi(u_3,y)$ are zero for y not equal to $y_1$ or $y_2$, the coefficients $\phi(u,y_1)$ and $\phi(u,y_2)$ are zero for u not equal to $u_2$ or $u_3$, and in that the number of coefficients of the analysis filters not being equal to the number of coefficients of the synthesis filters.

2. A digital transmission system as claimed in claim 1, wherein the coefficients belonging to corresponding pairs of values $(u_2,u_3)$ and $(y_1,y_2)$ satisfy:

$$\phi(u_2,y_1)=\phi(u_3,y_2)=c.M/2, \text{ and } \phi(u_2,y_2)=\phi(u_3,y_1),$$

where c is a constant value.

3. A digital transmission system as claimed in claim 2, wherein $\phi(u_2,y_2)=\phi(u_3,y_1)=c.M/2$.

4. A digital transmission system as claimed in claim 2, wherein $\phi(u_2,y_2)=\phi(u_3,y_1)=-c.M/2$.

5. A digital transmission system as claimed in claim 2 wherein $C=-1$.

6. A digital transmission system as claimed in claim 1, wherein, at least one separate pair of values $(u_0,u_1)$ and a corresponding separate pair of values $(y_0,y_4)$ are present for which the coefficients $\phi(u_0,y)$ and $\phi(u,y_4)$ are all zero, and all the coefficients $\phi(u_1,y)$ and $\phi(u,y_0)$ except one, which is $\phi(u_1,y_0)$, are zero.

7. A digital transmission system as claimed in claim 6, one of such pair of values $(u_0,u_1)$ and corresponding pair of values $(y_0,y_4)$ are present for which the coefficients $\phi(u,y)$ except one, which is $\phi(u_1,y_0)$ are zero, and in that for the remaining $2M-2$ values for u and y, $M-1$ separate pairs of values $\phi(u_2,u_3)$ and $M-1$ corresponding separate pairs $(y_1,y_2)$ are present for which the coefficients $\phi(u_2,y_1)$, $\phi(u_2,y_2)$, $\phi(u_3,y_1)$ and $\phi(u_3,y_2)$ are non zero.

8. A digital transmission system as claimed in claim 7, wherein $\phi(u_1,y_0)$ equals a value c.M.

9. A digital transmission system as claimed in claim 6 wherein the $y_4$-th input of the first processing unit as well as an output of one of the analysis filters which is coupled to the $y_4$-th input of the first processing unit may be dispensed with, and that the $u_0$-th output of the second processing unit as well as an input of one of the synthesis filters which is coupled to the $u_0$-th output of the second processing unit may be dispensed with.

10. A digital transmission system as claimed in claim 1, wherein the number of the filter coefficients in the synthesis filters is larger than the number of filter coefficients in the analysis filters.

11. A digital transmission system as claimed in claim 1 wherein the number of filter coefficients in the analysis filters is larger than the number of filter coefficients in the synthesis filters.

12. A digital transmission system as claimed in claim 1, wherein the analysis filter means comprises first commutator means having an input coupled to the input of the coder, for receiving the samples of the digital signal and M outputs for supplying M output signals with a sampling rate of $F_S/M$, the first commutator means being adapted to supply to the M outputs each time M samples that occur in consecutive blocks of M samples of the digitized input signal, such that the m-th sample of each block is supplied to the m-th output, each of the M outputs being coupled to an input of a corresponding one of M analysis filters, the synthesis filter means further comprising second commutator means having M inputs coupled to the M outputs of the synthesis filters and an output coupled to the output of the synthesis filter means, the second commutator means being adapted to arrange M samples, each time when they are present at the M inputs, one after the other in one block of consecutive blocks of M samples, the blocks being supplied to the output.

13. An apparatus for recording and/or reproducing a digital signal, such as a digital audio signal, having a given sampling rate $F_S$, in/from a track on a record carrier, the recording apparatus having an input for receiving the digital signal to be recorded and comprising a coder for subband coding of the digital signal and write means, the coder being responsive to the digital signal, for generating a number of M subband signals with sampling rate reduction, the coder dividing the digital signal band into successive subbands of band numbers $m(0 \leq m \leq M-1)$ increasing with frequency the subbands having approximately equal bandwidths, the coder comprising analysis filter means and a first signal processing unit, the analysis filter means comprising M analysis filters, each having one input and two outputs, the 2M outputs of the filters being coupled to 2M outputs of the analysis filter means for supplying 2M output signals with a sampling rate $F_S/M$, each analysis filter being adapted to apply two different filterings on the signal applied to its input signal and to supply each of the two different filtered versions of that input signal to a corresponding one of the two outputs, each one of the 2M filter outputs being coupled to a corresponding one of 2M inputs of the first signal processing unit, the first processing unit having M outputs coupled to M outputs of the coder for supplying the M subband signals, the first signal processing unit being adapted to supply output signals on each of M outputs, an output signal being a combination of at least a number of input signals applied to its 2M inputs, the M outputs of the first processing unit being coupled to corresponding inputs of the write means, the write means being adapted to convert the M subband signals to a form in which it can be recorded on at least one track on the record carrier, the reproducing apparatus comprising read means and a decoder for decoding the subband coded digital signal, the read means being adapted to read signals from the at least one track on the record carrier and to convert the signals read from the track into M subband signals, M outputs of the write means being coupled to corresponding inputs of the decoder, the decoder being responsive to the M subband signals for constructing a replica of the digital signal, this decoder merging the subbands to the digital signal band, with sampling rate increase, the decoder comprising a second signal processing unit and synthesis filter means, the second signal processing unit having M inputs for receiving the M subband signals and having 2M outputs, the synthesis filter means comprising M synthesis filters each having 2 inputs, and one output coupled to the decoder output, the second signal processing unit being adapted to generate an output signal on each of its 2M outputs, an output signal being a combination of at least a number of input signals applied to its M inputs, each pair of outputs of the second signal processing unit being coupled to a pair of two inputs of a corresponding one of the M synthesis filters, each synthesis filter having one output, each synthesis filter being adapted to apply different filterings on the two signals applied to the two inputs and to supply a combination of the two filtered signals to its output, each output can be coupled to the output of the synthesis filter means for supplying the replica of the digital signal having a sampling rate $F_S$, the coefficients of the analysis or the synthesis filters being derived from the coefficients of a standard filter having a low pass filter characteristic with a bandwidth approximately equal to half the bandwidth of the subbands, $\alpha(x,y)$ in a $M \times 2M$ coefficient matrix A being the multiplication coefficient in the first processing unit, with which the input signal applied to the y-th of the 2M inputs of the first processing unit is multiplied before it is applied to the x-th of the M outputs of the first processing unit, $\beta(u,v)$ in a $2M \times M$ coefficient matrix B being the multiplication coefficient in the second processing unit, with which the input signal applied to the v-th of the M inputs of the second processing unit is multiplied before it is applied to the u-th of the 2M outputs of the second processing unit, wherein the coefficients $\alpha(x,y)$ and $\beta(u,v)$ are chosen such that, if coefficients $\phi(u,y)$ in a $2M \times 2M$ coefficient matrix C are calculated in accordance with the following formula $$\phi(u,y) = \sum_{i=0}^{M-1} \beta(u,i)\alpha(i,y)$$

from the coefficients $\alpha(x,y)$ and $\beta(u,v)$, a number of at least two separate pairs of values $(u_2,u_3)$ and corresponding separate values $(y_1,y_2)$ are present for which the coefficients $\phi(u_2,y_1)$, $\phi(u_2,y_2)$, $\phi(u_3,y_1)$ and $\phi(u_3,y_2)$ are not zero, the coefficients $\phi(u_2,y)$ and $\phi(u_3,y)$ are zero for y not equal to $y_1$ or $y_2$, the coefficients $\phi(u,y_1)$ and $\phi(u,y_2)$ are zero for u not equal to $u_2$ or $u_3$, and in that the number of coefficients of the analysis filters not being equal to the number of coefficients of the synthesis filters.

14. An apparatus as claimed in claim 13, wherein the coefficients belonging to corresponding pairs of values $(u_2,u_3)$ and $(y_1,y_2)$ satisfy:

$$\phi(u_2,y_1) = \phi(u_3,y_2) = c.M/2 \text{ and}$$

$$\phi(u_2,y_2) = \phi(u_3,y_1),$$

where c is a constant value.

15. An apparatus as claimed in claim 14, wherein $\phi(u_2,y_2) = \phi(u_3,y_1) = c.M/2$.

16. An apparatus as claimed in claim 14, wherein $\phi(u_2,y_2) = \phi(u_3,y_1) = -c.M/2$.

17. An apparatus as claimed in claim 14, wherein $c=1$.

18. An apparatus as claimed in claim 13, wherein, at least one separate pair of values $(u_0,u_1)$ and a corresponding separate pair of values $(y_0,y_4)$ are present for which the coefficients $\phi(u_0,y)$ and $\phi(u,y_4)$ are all zero, and all the coefficients $\phi(u_1,y)$ and $\phi(u,y_0)$ except one, which is $\phi(u_1,y_0)$, are zero.

19. An apparatus as claimed in claim 18, wherein one of such pair of values $(u_0,u_1)$ and corresponding pair of values $(y_0,y_4)$ are present for which the coefficients $\phi(u,y)$ except one, which is $\phi(u_1,y_0)$, are zero, and in that for the remaining $2M-2$ values for u and y, $M-1$ separate pairs of values $(u_2,u_3)$ and $M-1$ corresponding separate pairs $(y_1,y_2)$ are present for which the coefficients $\phi(u_2,y_1)$, $\phi(u_2,y_2)$, $\phi(u_3,y_1)$ and $\phi(u_3,y_2)$ are non zero.

20. An apparatus as claimed in claim 19, wherein $\phi(u_1,y_0)$ equals a value c.M.

21. An apparatus as claimed in claim 18, wherein the $y_4$-th input of the first processing unit as well as an output of one of the analysis filters which is coupled to the $y_4$-th input of the first processing unit may be dispensed with, and that the $u_0$-th output of the second processing unit as well as an input of one of the synthesis filters which is coupled to the $u_0$-th output of the second processing unit may be dispensed with.

22. An apparatus as claimed in claim 13, wherein the number of the filter coefficients in the synthesis filters are larger than the number of filter coefficients in the analysis filters.

23. An apparatus as claimed in claim 13, wherein the number of filter coefficients in the analysis filters are larger than the number of filter coefficients in the synthesis filters.

24. An apparatus as claimed in claim 13, wherein the analysis filter means comprises first commutator means having an input coupled to the input of the coder, for receiving the samples of the digital signal and M outputs for supplying M output signals with a sampling rate of $F_S/M$, the first commutator means being adapted to supply to the M outputs each time M samples that occur in consecutive blocks of M samples of the digitized input signal, such that the m-th sample of each block is supplied to the m-th output, each of the M outputs being coupled to an input of a corresponding one of M analysis filters, the synthesis filter means further comprising a second commutator means having M inputs coupled to the M outputs of the synthesis filters and an output coupled to the output of the synthesis filter means, the second commutator means being adapted to arrange M samples, each time when they are present at the M inputs, one after the other in one block of consecutive blocks of M samples, the blocks being supplied to the output.

25. A transmitter, for use in the digital transmission system as claimed in claim 1, wherein the coefficients of the analysis filters in the transmitter have been derived from the requirement that, given the coefficients for the first and second signal processing units in the transmitter and the corresponding receiver in the transmission system, and given the coefficients for the synthesis filters in the said receiver, the total transmission of the system exhibits a substantially frequency independent amplification and a substantially frequency independent delay, the coefficients for the synthesis filters being derived from the coefficients of the standard filter having the low pass filter characteristic with the bandwidth approximately equal to half the bandwidth of the subbands.

26. A receiver, for use in the digital transmission system as claimed in claim 1, wherein the coefficients of the synthesis filters in the receiver have been derived from the requirement that, given the coefficients for the first and second signal processing units in the transmitter and the corresponding receiver in the transmission system, and given the coefficients for the analysis filters in the said transmitter, the total transmission of the system exhibits a substantially frequency independent amplification and a substantially frequency independent delay, the coefficients for the analysis filters being derived from the coefficients of the standard filter having the low pass filter characteristic with the bandwidth approximately equal to half the bandwidth of the subbands.

* * * * *